United States Patent
Nogami et al.

(10) Patent No.: US 10,090,320 B2
(45) Date of Patent: Oct. 2, 2018

(54) SEMICONDUCTOR DEVICE AND METHOD FOR MANUFACTURING THE SAME

(71) Applicant: Toshiba Memory Corporation, Tokyo (JP)

(72) Inventors: Jun Nogami, Mie (JP); Gaku Sudo, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 56 days.

(21) Appl. No.: 15/267,924

(22) Filed: Sep. 16, 2016

(65) Prior Publication Data

US 2017/0338240 A1 Nov. 23, 2017

Related U.S. Application Data

(60) Provisional application No. 62/338,734, filed on May 19, 2016.

(51) Int. Cl.

| | |
|---|---|
| H01L 21/44 | (2006.01) |
| H01L 23/02 | (2006.01) |
| H01L 21/768 | (2006.01) |
| H01L 27/11582 | (2017.01) |
| H01L 27/11556 | (2017.01) |
| H01L 23/522 | (2006.01) |
| H01L 23/528 | (2006.01) |

(52) U.S. Cl.
CPC .. *H01L 27/11582* (2013.01); *H01L 21/76895* (2013.01); *H01L 23/528* (2013.01); *H01L 23/5226* (2013.01); *H01L 27/11556* (2013.01)

(58) Field of Classification Search
CPC ........... H01L 27/1128; H01L 27/11514; H01L 27/11551; H01L 27/11578
See application file for complete search history.

(56) References Cited

U.S. PATENT DOCUMENTS

| | | | |
|---|---|---|---|
| 6,534,403 B2 * | 3/2003 | Cleeves | H01L 21/76804 257/E21.578 |
| 6,704,218 B2 | 3/2004 | Rickes et al. | |
| 7,211,885 B2 | 5/2007 | Nordal et | |

(Continued)

FOREIGN PATENT DOCUMENTS

JP 58-95860 6/1983

*Primary Examiner* — Benjamin Sandvik
(74) *Attorney, Agent, or Firm* — Finnegan, Henderson, Farabow, Garrett & Dunner, L.L.P.

(57) ABSTRACT

A semiconductor device according to an embodiment, includes a stacked body, a plurality of first terraces, a second terrace, a plurality of interconnects, a plurality of conductive bodies. The stacked body includes a plurality of electrode layers. The stacked body includes a stairstep portion at an end portion of the stacked body. The plurality of first terraces are provided in the stairstep portion. The second terrace is provided in the stairstep portion. The plurality of interconnects are provided from the second terrace to the plurality of first terraces. The plurality of interconnects contact one of the plurality of electrode layers at the stairstep portion. The plurality of conductive bodies are provided above the second terrace. The plurality of conductive bodies extend in a stacking direction of the stacked body. The conductive bodies contact the interconnects above the second terrace.

20 Claims, 26 Drawing Sheets

(56) References Cited

U.S. PATENT DOCUMENTS

| | | | |
|---|---|---|---|
| 8,704,288 B2* | 4/2014 | Lee | H01L 27/11519 |
| | | | 257/316 |
| 9,147,583 B2* | 9/2015 | Leal | H01L 21/56 |
| 9,570,392 B2* | 2/2017 | Okajima | H01L 21/76801 |
| 9,941,122 B2* | 4/2018 | Oh | H01L 21/0274 |
| 2011/0031630 A1* | 2/2011 | Hashimoto | H01L 27/11578 |
| | | | 257/774 |
| 2012/0181602 A1 | 7/2012 | Fukuzumi et al. | |
| 2014/0286095 A1 | 9/2014 | Hishida et al. | |
| 2016/0322376 A1* | 11/2016 | Lee | H01L 27/11529 |
| 2017/0271256 A1* | 9/2017 | Inatsuka | H01L 23/528 |
| 2017/0271363 A1 | 9/2017 | Kamigaki et al. | |
| 2017/0287833 A1* | 10/2017 | Thimmegowda | |
| | | | H01L 21/76879 |

* cited by examiner

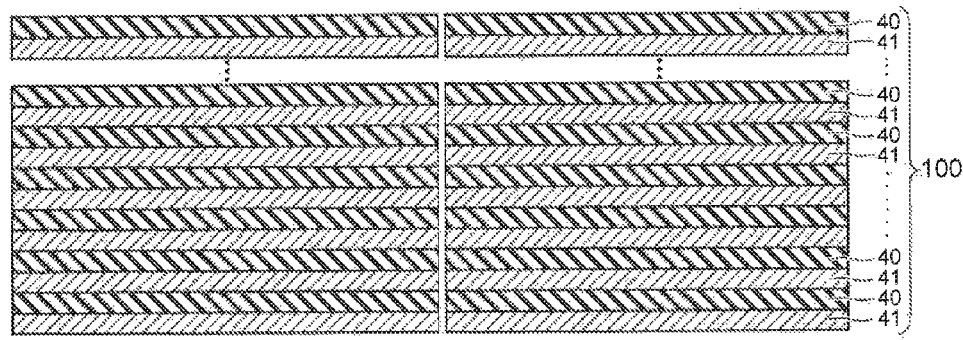
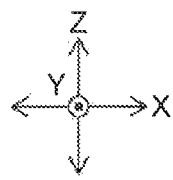
FIG. 12A
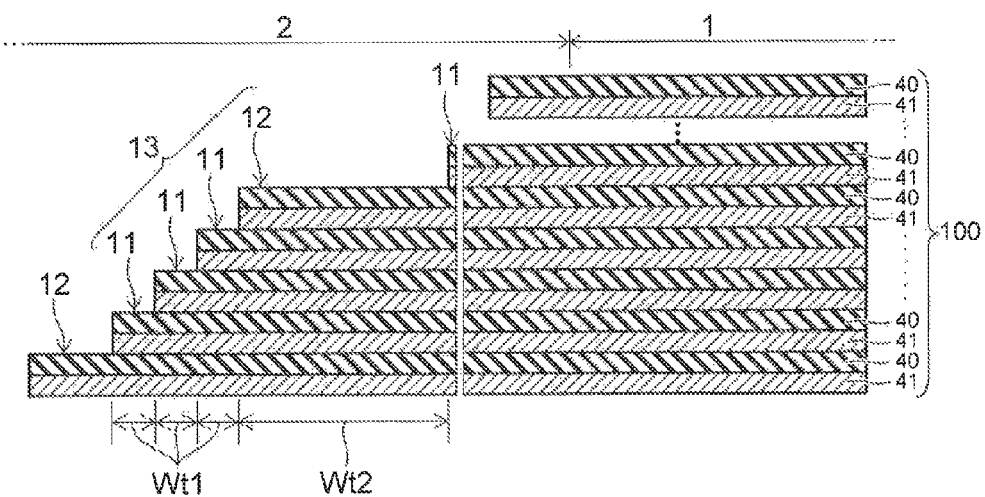
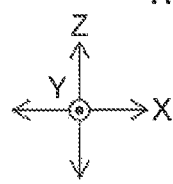
FIG. 12B

SEMICONDUCTOR DEVICE AND METHOD FOR MANUFACTURING THE SAME

CROSS-REFERENCE TO RELATED APPLICATIONS

This application is based upon and claims the benefit of priority from U.S. Provisional Patent Application 62/338,734, filed on May 19, 2016; the entire contents of which are incorporated herein by reference.

FIELD

Embodiments described herein relate generally to a semiconductor device and a method for manufacturing the same.

BACKGROUND

A memory device having a three-dimensional structure has been proposed in which memory holes are formed in a stacked body in which multiple electrode layers are stacked, and a charge storage film and a semiconductor film are provided to extend in the stacking direction of the stacked body inside the memory hole. The memory device has multiple memory cells connected in series between a drain-side selection transistor and a source-side selection transistor. The electrode layers of the stacked body are word lines and selection gates. The stacked body has a stairstep portion at the end portion of the stacked body. The stairstep portion includes multiple terraces. The terraces are the portions of the electrode layers drawn out to the outer side of the stacked body. Contacts that connect the electrode layers to a memory peripheral circuit are provided at the terraces. Therefore, the planar sizes of the terraces easily become large and impede downscaling of the memory device. It is desirable to reduce the planar size of the stairstep portion.

BRIEF DESCRIPTION OF THE DRAWINGS

FIG. 12A to FIG. 12I are schematic cross-sectional views along line XII-XII of FIG. 11A to FIG. 11I;

DETAILED DESCRIPTION

A semiconductor device according to an embodiment, includes a stacked body, a plurality of first terraces, a second terrace, a plurality of interconnects, a plurality of conductive bodies. The stacked body includes a plurality of electrode layers. The plurality of electrode layers are stacked with an insulating body interposed. The stacked body includes a stairstep portion at an end portion of the stacked body. The plurality of first terraces are provided in the stairstep portion. Steps of the first terraces extend in a first direction. The second terrace is provided in the stairstep portion. The second terrace width of the second terrace is wider than a first terrace width of the first terrace. The first and second terrace widths are aligned with a second direction crossing the first direction. The plurality of interconnects are provided from the second terrace to the plurality of first terraces. The plurality of interconnects contact one of the plurality of electrode layers at the stairstep portion, portions where the interconnects and the electrode layers are in contact being aligned with a plane crossing an upper surface of the second terrace. The plurality of conductive bodies are provided above the second terrace. The plurality of conductive bodies extend in a stacking direction of the stacked body. The conductive bodies contact the interconnects above the second terrace.

<Semiconductor Device>

Figure 1:
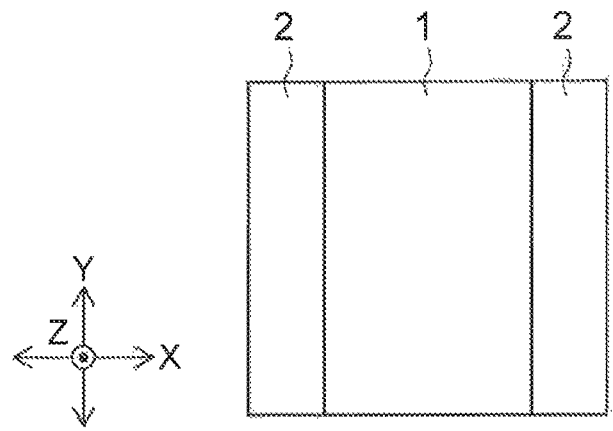
FIG. 1 is a schematic plan view showing a planar layout of a semiconductor device of an embodiment.

FIG. 1 is a schematic plan view showing a planar layout of a semiconductor device of an embodiment.

As shown in FIG. 1, the semiconductor device of the first embodiment includes a memory cell array 1 and a stairstep portion 2. The memory cell array 1 and the stairstep portion 2 are provided on a substrate. The stairstep portion 2 is provided outside the memory cell array 1. In FIG. 1, two mutually-orthogonal directions parallel to a major surface of the substrate are taken as an X-direction and a Y-direction. A direction that crosses, e.g., is orthogonal to, both the X-direction and the Y-direction is taken as a Z-direction. In the specification, "down" refers to the direction toward the substrate; and "up" refers to the direction away from the substrate.

Figure 2:
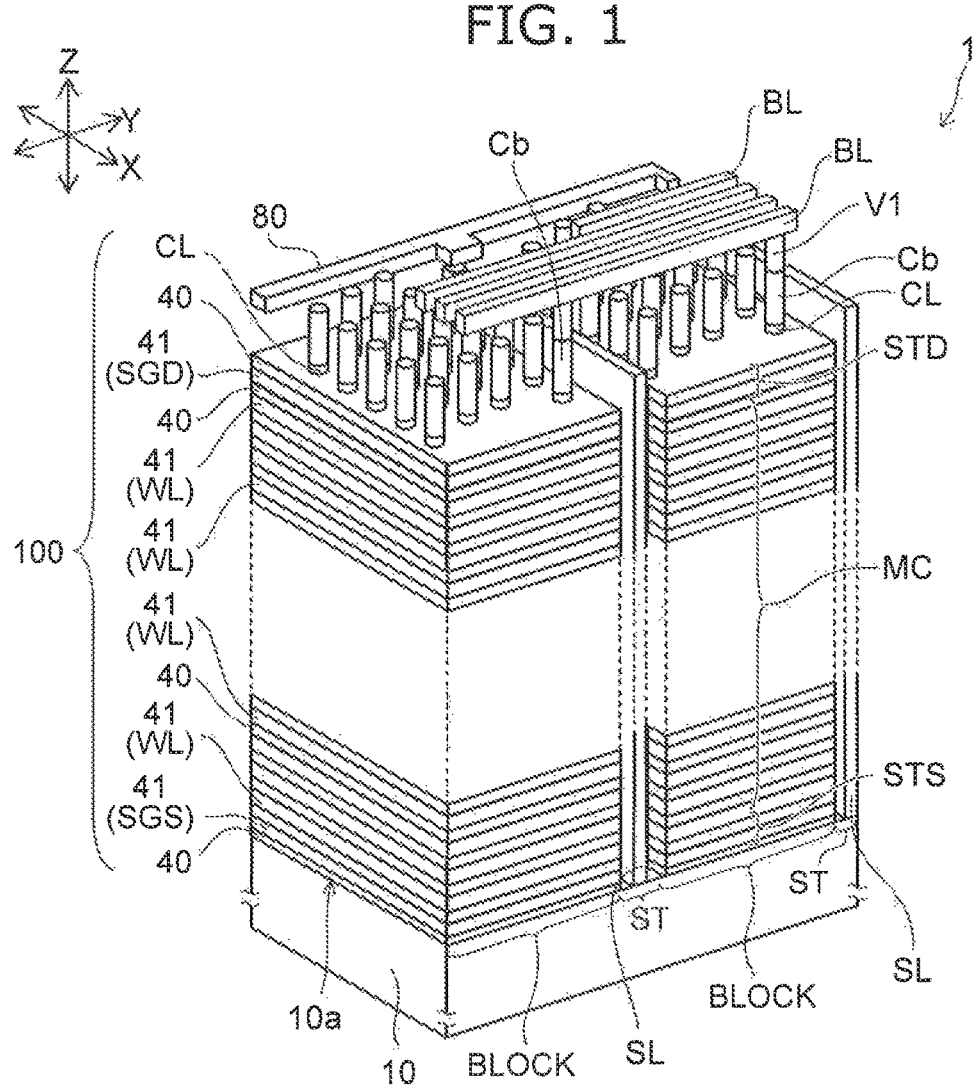
FIG. 2 is a schematic perspective view of the memory cell array of the semiconductor device of the embodiment.

FIG. 2 is a schematic perspective view of the memory cell array 1 of the semiconductor device of the embodiment.

As shown in FIG. 2, the memory cell array 1 includes a stacked body 100. The stacked body 100 is provided on a major surface 10a of a substrate 10. The substrate 10 includes, for example, a P-type silicon layer that is crystallized. The stacked body 100 includes multiple insulating bodies 40 and multiple electrode layers 41 that are stacked alternately. The insulating body 40 includes an insulator. The insulator is, for example, silicon oxide. The electrode layer 41 includes a conductor. The conductor is, for example, polysilicon, tungsten (W), molybdenum (Mo), etc. The multiple electrode layers 41 include at least one source-side selection gate (SGS), multiple word lines WL, and at least one drain-side selection gate (SGD). The source-side selection gate (SGS) is a gate electrode of a source-side selection transistor STS. The word lines (WL) are gate electrodes of memory cells MC. The drain-side selection gate (SGD) is a gate electrode of a drain-side selection transistor STD. The number of stacks of the electrode layers 41 is arbitrary.

The source-side selection gate (SGS) is provided in the lower region of the stacked body 100. The drain-side selection gate (SGD) is provided in the upper region of the stacked body 100. The lower region refers to the region on the side of the stacked body 100 proximal to the substrate 10; and the upper region refers to the region on the side of the stacked body 100 distal to the substrate 10. For example, at least one of the multiple electrode layers 41 including the electrode layer 41 most proximal to the substrate 10 is used as a source-side selection gate SGS. At least one of the multiple electrode layers 41 including the electrode layer 41 most distal to the substrate 10 is used as the drain-side selection gate (SGD). The word lines WL are provided in an intermediate region between the lower region and upper region of the stacked body 100.

A slit ST and columnar units CL are provided inside the stacked body 100. The columnar units CL extend in the Z-direction (the stacking direction of the stacked body 100). The slit ST extends in the Z-direction and the X-direction. For example, a source line SL is provided inside the slit ST. The source line SL is provided inside the slit ST in a state of being electrically insulated from the stacked body 100. For example, the lower end of the source line SL is electrically connected to the source region of the source-side selection transistor STS. The upper end of the source line SL is connected to a shunt interconnect 80. The shunt interconnect 80 is electrically connected by shunt connections to the multiple source lines SL along the Y-direction. The lower end of the slit ST reaches the substrate 10. The slit ST electrically divides the stacked body 100 into multiple regions along the Y-direction. For example, the divided regions are called "blocks." The block is, for example, the smallest unit of the information erase. The erase size is set by combining one block or multiple blocks.

For example, the upper ends of the columnar units CL are electrically connected to bit lines BL via contacts Cb and conductive bodies V1. For example, the bit lines BL extend in the Y-direction crossing the slit ST.

Figure 3:
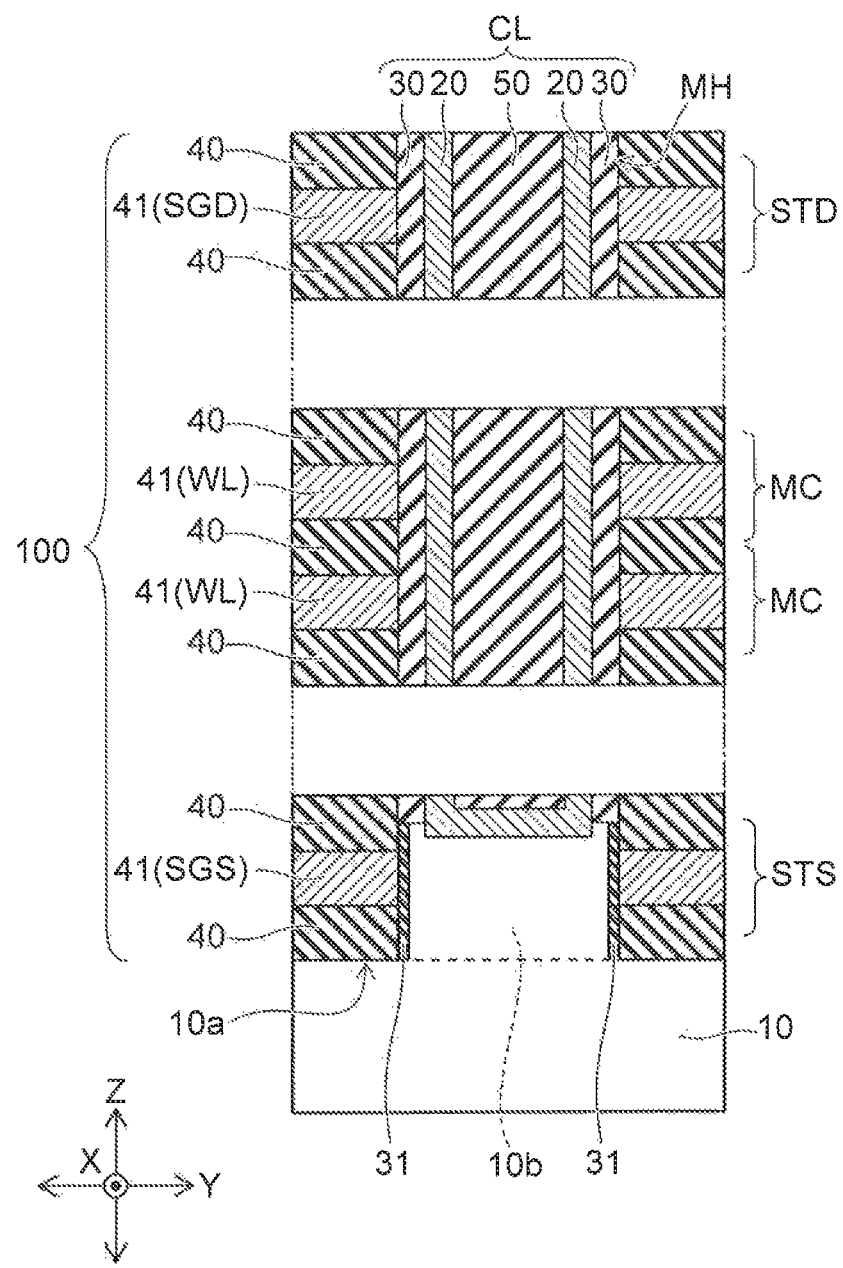
FIG. 3 is a schematic cross-sectional view showing an enlarged columnar unit.

FIG. 3 is a schematic cross-sectional view showing an enlarged columnar unit CL.

As shown in FIG. 3, a memory hole MH is provided inside the stacked body 100. The memory hole MH is a hole extending in the Z-direction. The columnar unit CL is provided inside the memory hole MH. The memory hole MH is formed in a circular columnar configuration or an elliptical columnar configuration. The lower end of the memory hole MH reaches the substrate 10.

The columnar unit CL includes a memory film 30, a semiconductor body 20, and a core layer 50. The memory film 30, the semiconductor body 20, and the core layer 50 are provided inside the memory hole MH. The memory film 30 includes a charge storage unit inside a film. The charge storage unit includes, for example, a floating gate and/or trap sites that trap charge. The threshold voltage of the memory cell MC changes according to the existence or absence of the charge or the amount of the charge inside the charge storage unit. Thereby, the memory cell MC stores information. Although not illustrated in FIG. 3, the memory film 30 includes a tunneling insulating film between the charge storage unit and the semiconductor body 20. Also, although similarly not illustrated in FIG. 3, the memory film 30 includes a blocking insulating film between the charge storage unit and the electrode layers 41. Tunneling of the charge, e.g., electrons, in the tunneling insulating film occurs when erasing and programming the information. The memory film 30 may be removed at the portion where the electrode layer 41 used as a drain-side selection gate SGD is formed. In such a case, the gate insulating film of the drain-side selection transistor STD is formed instead of the memory film 30.

The semiconductor body 20 extends in the Z-direction. The semiconductor body 20 includes, for example, P-type silicon that is crystallized. For example, the semiconductor body 20 is electrically connected to the substrate 10 via a semiconductor pillar 10b. The semiconductor pillar 10b is provided at the bottom of the memory hole MH. The semiconductor pillar 10b includes, for example, P-type silicon that is crystallized. The semiconductor pillar 10b contacts the substrate 10 and is included in a portion of the substrate 10. For example, the semiconductor pillar 10b opposes the electrode layer 41 (the source-side selection gate SGS) with a gate insulating film 31 interposed. The semiconductor pillar 10b may be omitted. In the case where the semiconductor pillar 10b is omitted, for example, the memory film 30 and the semiconductor body 20 extend to the portion where the source-side selection transistor STS is formed; and the semiconductor body 20 directly contacts the substrate 10. The core layer 50 includes an insulator. The core layer 50 fills the memory hole MH in which the memory film 30 and the semiconductor body 20 are provided.

Figure 4:
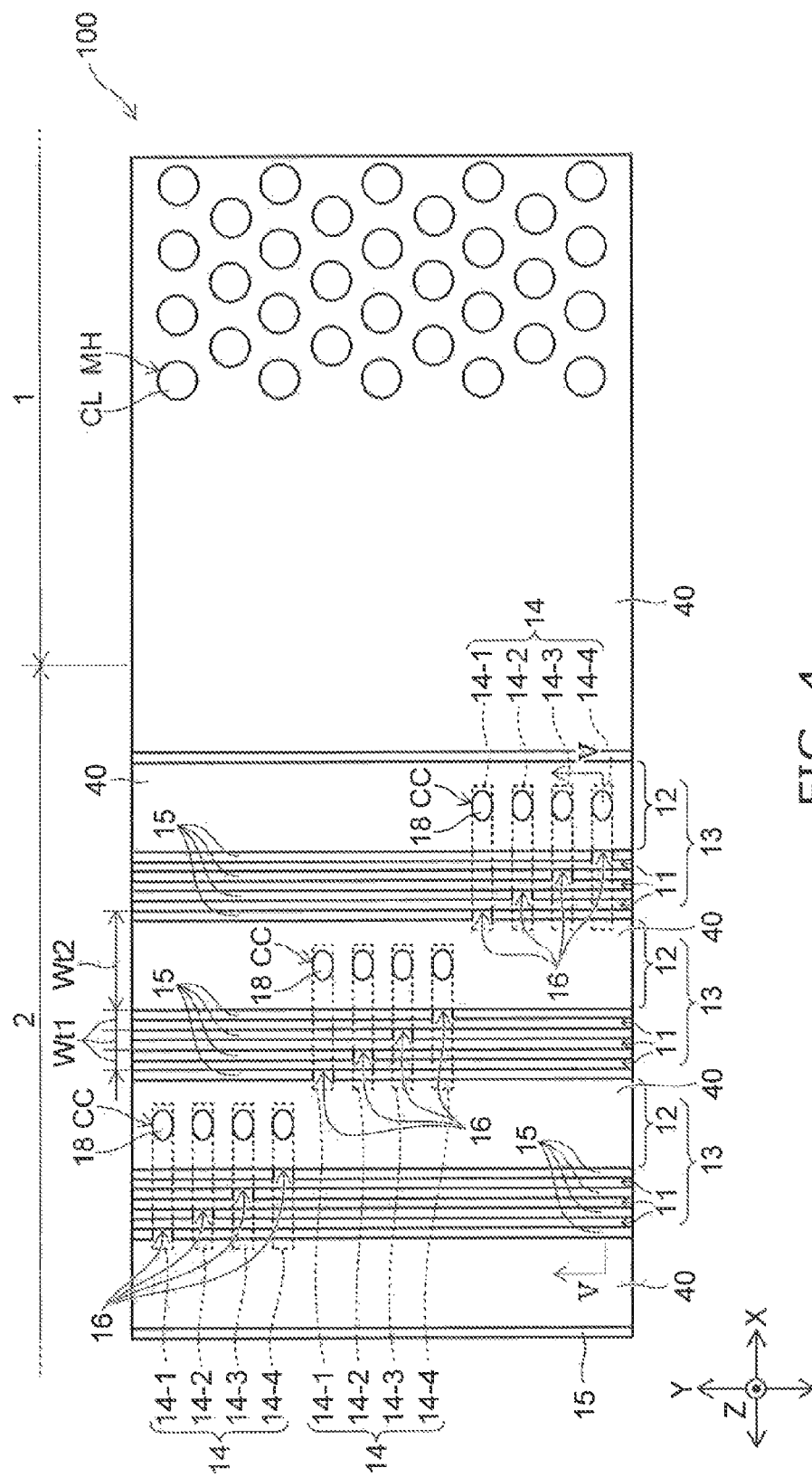
FIG. 4 is a schematic plan view of the memory cell array and the stairstep portion of the semiconductor device of the embodiment.
Figure 5:
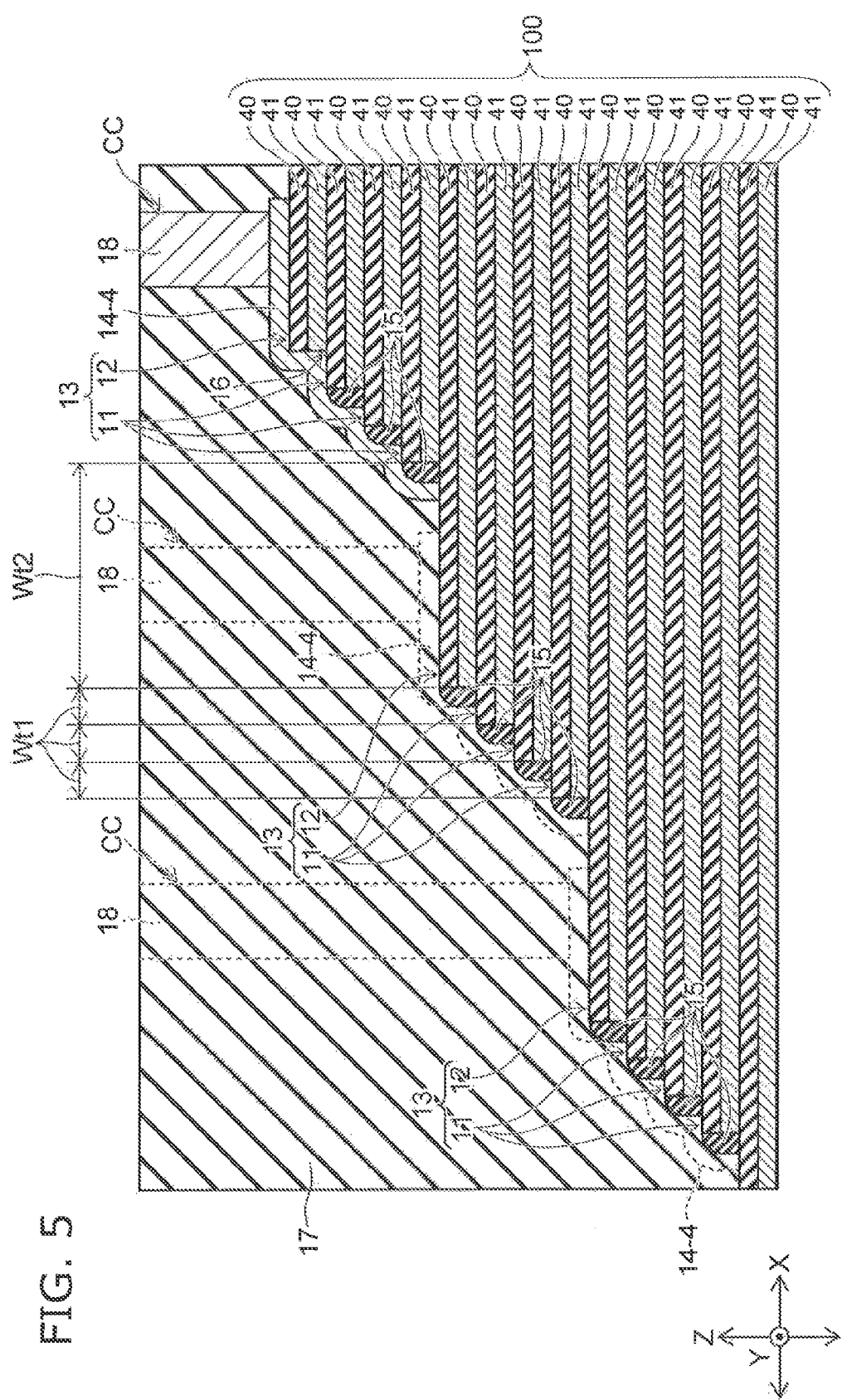
FIG. 5 is a schematic cross-sectional view along line V-V of FIG. 4.
Figure 6:
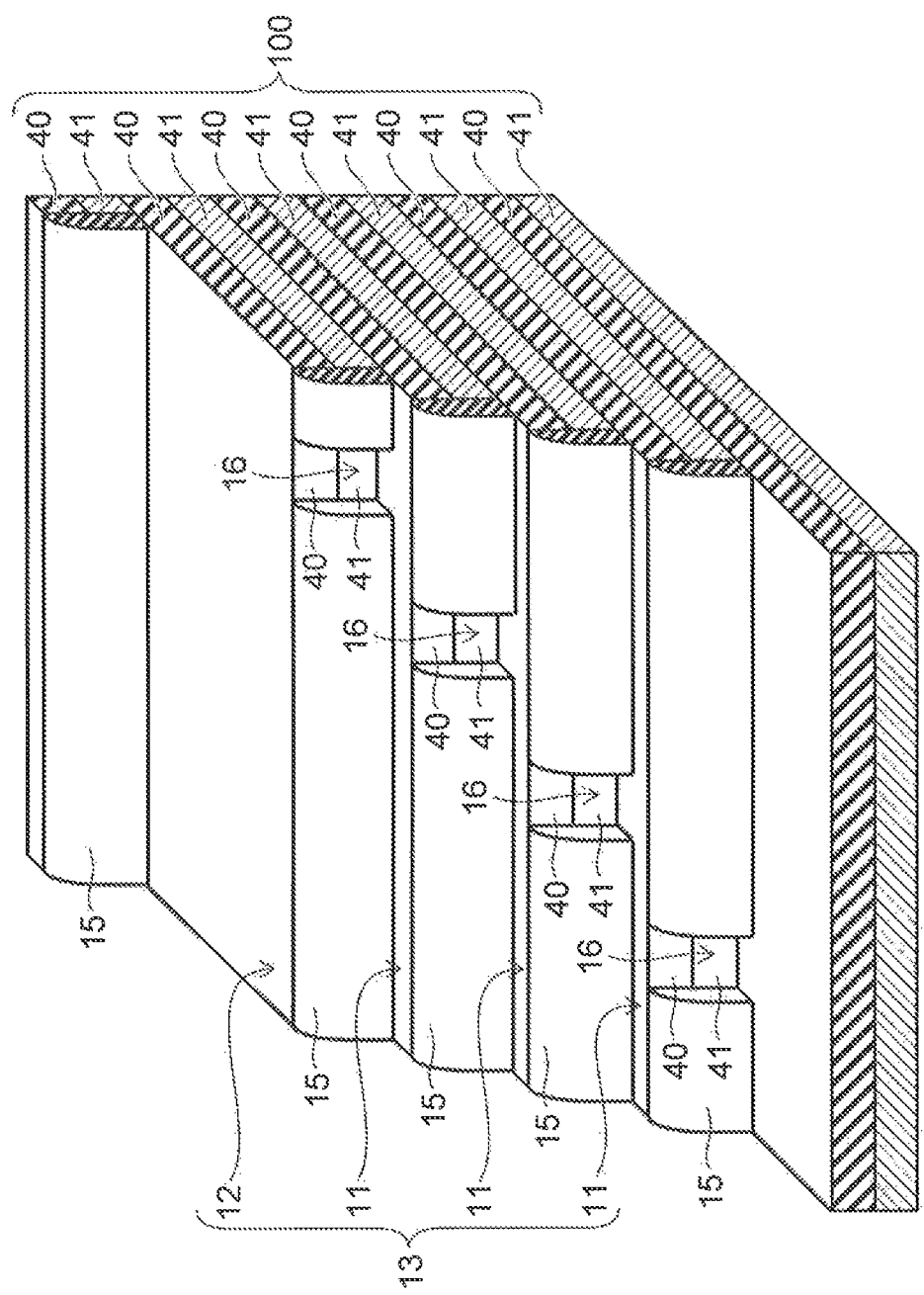
FIG. 6 is a schematic perspective view showing an enlarged portion of the stairstep portion.

FIG. 4 is a schematic plan view of the memory cell array 1 and the stairstep portion 2 of the semiconductor device of the embodiment. FIG. 5 is a schematic cross-sectional view along line V-V of FIG. 4. FIG. 6 is a schematic perspective view showing an enlarged portion of the stairstep portion 2.

As shown in FIG. 4 to FIG. 6, the stacked body 100 includes the stairstep portion 2 at an end portion of the stacked body 100. A second terrace 12 and multiple first terraces 11 are provided in the stairstep portion 2. In the embodiment, for example, three first terraces 11 are provided for one second terrace 12. The number of the first terraces 11 provided for one second terrace 12 is arbitrary. For example, one insulating body 40 and one electrode layer 41 are included in the first terraces 11 and the second terrace 12. The insulating bodies 40 are provided in the upper portions of the first terraces 11 and the second terrace 12; and the electrode layers 41 are provided in the lower portions of the first terraces 11 and the second terrace 12. In the specification, the width along the X-direction of the terrace is defined as the "terrace width." A terrace width Wt2 of the second terrace 12 is wider than a terrace width Wt1 of the first terrace 11. In the embodiment, a structure body 13 that includes three first terraces 11 and one second terrace 12 is provided to be multiply repeated in the stairstep portion 2.

Multiple interconnects 14 are provided from the second terrace 12 to the multiple first terraces 11. Each of the interconnects 14 includes a conductor. The configuration of each of the interconnects 14 is a rectangular configuration when viewed in plan. The number of the interconnects 14 included in one structure body 13 is the number of the first terraces 11 plus one second terrace 12. In the embodiment, one structure body 13 includes four interconnects 14 (14-1 to 14-4). For example, the interconnects 14 contact the electrode layers 41 inside the structure body 13 via the side surfaces of the electrode layers 41.

Sidewall insulating films 15 are provided on the first terraces 11 and the second terrace 12. The sidewall insulating films 15 cover the side surface of the insulating bodies 40 and the electrode layers 41 on the first terraces 11 and the second terrace 12. The sidewall insulating films 15 include an insulator that can have etching selectivity with the insulating bodies 40. For example, in the case where the insulating bodies 40 include silicon oxide, the sidewall insulating films 15 include silicon nitride. The sidewall insulating films 15 have exposed regions 16 where the side surfaces of the electrode layers 41 are exposed. A perspective view of an enlarged portion of the stairstep portion 2 is shown in FIG. 6. The interconnects 14 are not illustrated in FIG. 6.

In the exposed regions 16 as shown in FIG. 6, the sidewall insulating films 15 are removed; and the side surfaces of the insulating bodies 40 and the side surfaces of the electrode layers 41 are exposed. An example is shown in FIG. 6 in which the sidewall insulating films 15 are removed from the upper ends of the sidewall insulating films 15 to reach the first terraces 11 and the second terrace 12. The sidewall insulating films 15 may not be removed to reach the first terraces 11 and the second terrace 12; and it is sufficient for the sidewall insulating films 15 to be removed so that the side surfaces of the electrode layers 41 are exposed.

The interconnects 14 contact the electrode layers 41 via the exposed regions 16. Thereby, the multiple interconnects 14 are electrically connected respectively to the multiple electrode layers 41 inside the one structure body 13. In the embodiment, the interconnect 14-1 is electrically connected to the electrode layer 41 positioned at the lowermost layer inside the one structure body 13. Then, the interconnects 14-2 and 14-3 are electrically connected sequentially to the electrode layers 41 positioned at the upper layers; and the interconnect 14-4 is electrically connected to the electrode layer 41 positioned at the uppermost layer inside the one structure body 13. An insulating film 17 is provided on the stairstep portion 2 where the interconnects 14 are provided.

Multiple contact holes CC are provided in the insulating film 17. Each of the contact holes CC extends in the Z-direction through the insulating film 17. The contact holes CC respectively reach the interconnects 14 on the second terrace 12. A columnar conductive body 18 is provided inside each of the contact holes CC. The columnar conductive body 18 extends in the Z-direction and contacts the interconnect 14 above the second terrace 12. The columnar conductive body 18 is electrically connected to the interconnect 14.

Figure 7:
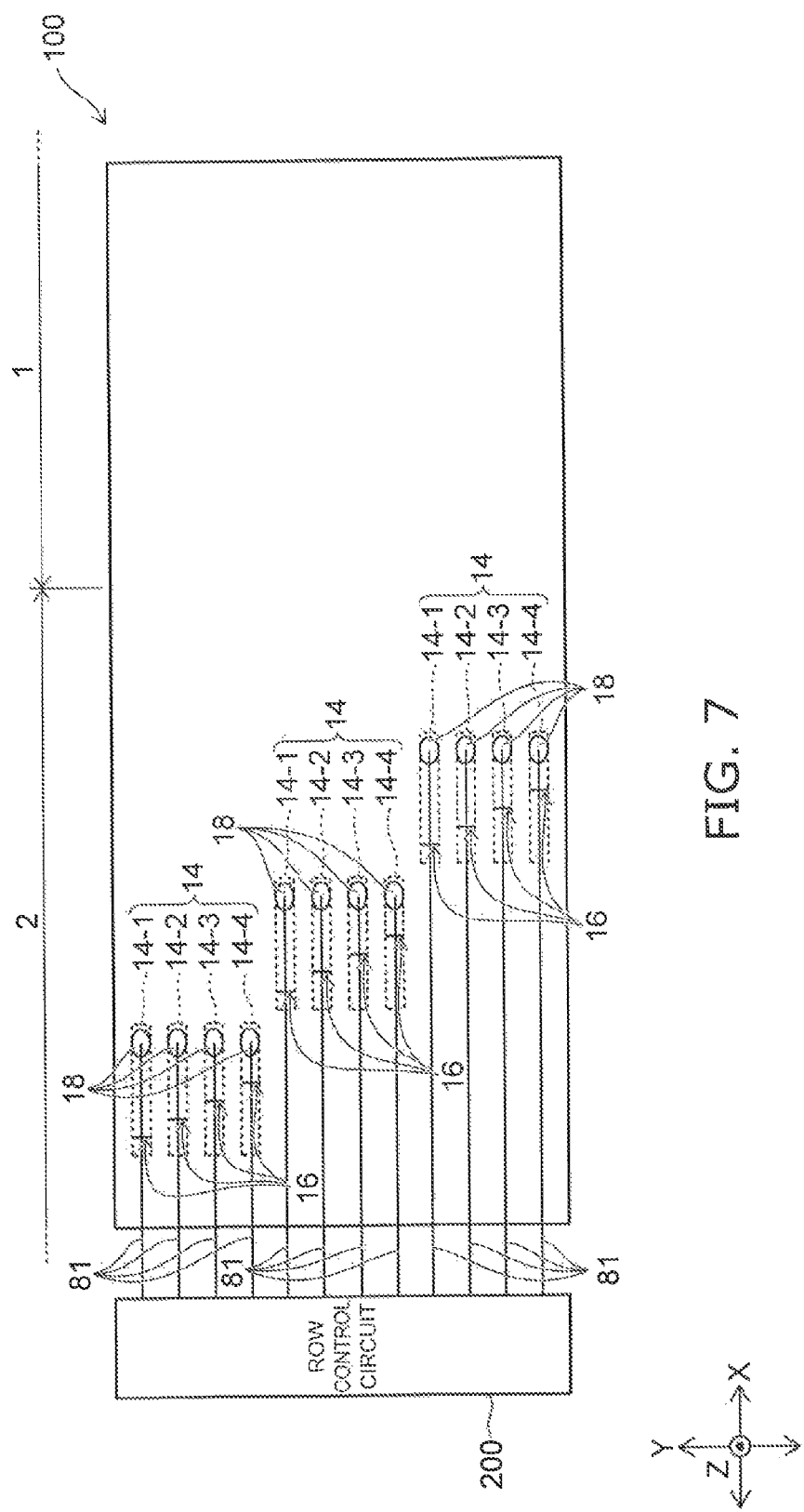
FIG. 7 is a schematic plan view of the memory cell array and the stairstep portion of the semiconductor device of the embodiment.

FIG. 7 is a schematic plan view of the memory cell array 1 and the stairstep portion 2 of the semiconductor device of the embodiment. The interconnects that are connected to the columnar conductive bodies 18 are shown in FIG. 7.

As shown in FIG. 7, interconnects 81 are electrically connected to the columnar conductive bodies 18. For example, the interconnects 81 are interconnects that conduct the output potentials of a row control circuit 200 to the electrode layers 41. The row control circuit 200 includes, for example, a drive circuit that drives the word lines WL, the source-side selection gate SGS, and the drain-side selection gate SGD. In the embodiment, the output potentials of the row control circuit 200 are conducted to the electrode layers 41 by the paths of the interconnects 81 to the columnar conductive bodies 18 to the interconnects 14 to the exposed regions 16.

Figure 8:
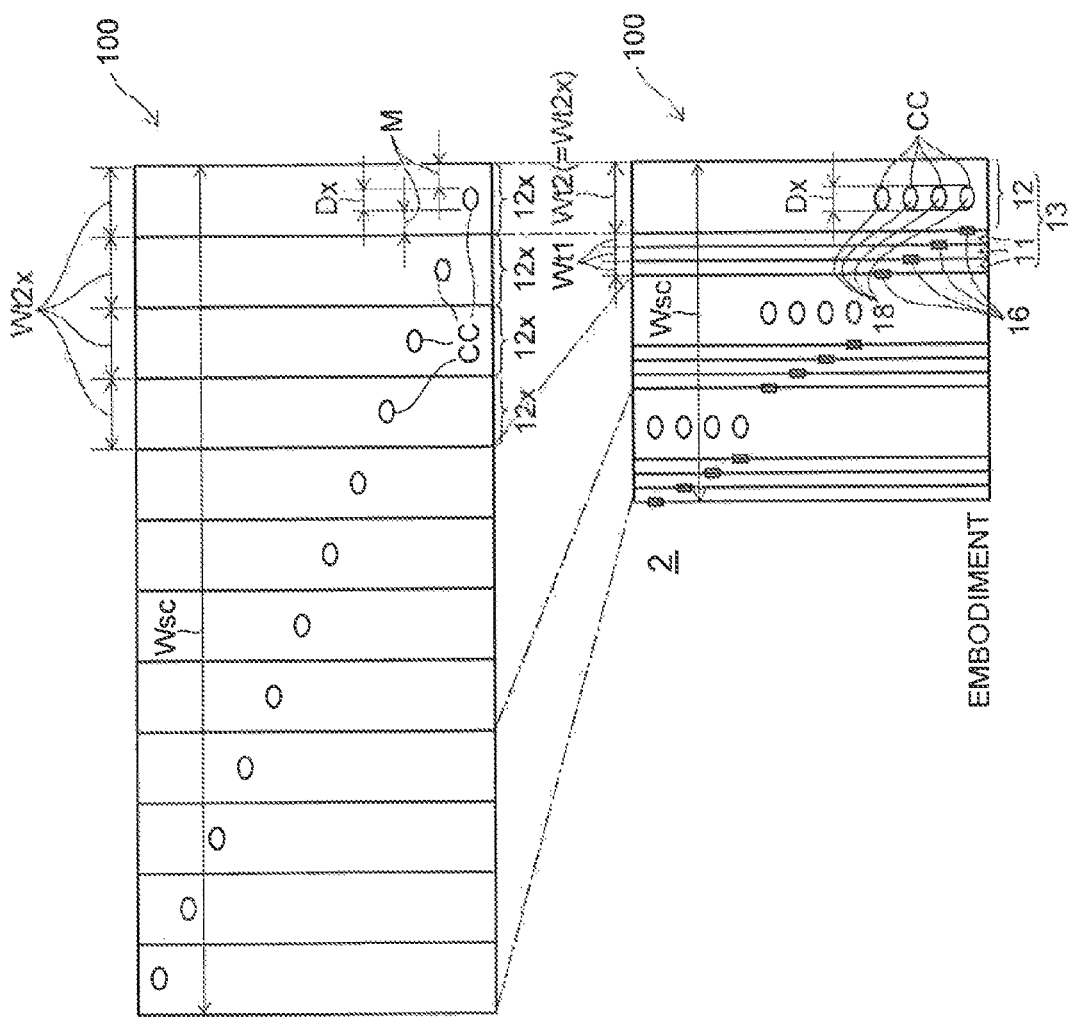
FIG. 8 is a schematic plan view showing a comparison of a reference example and the embodiment.

FIG. 8 is a schematic plan view showing a comparison of a reference example and the embodiment.

As shown in FIG. 8, the reference example is an example in which terraces $12x$ that have the same terrace width are multiply repeated in the stairstep portion 2. The contact hole CC is provided on each of the terraces $12x$. For example, a terrace width $Wt2x$ of the terrace $12x$ can be expressed as $$Wt2x = Dx + 2M \tag{1}$$

where Dx is the diameter along the X-direction of the contact hole CC. In Formula (1), "M" is, for example, the alignment margin in the X-direction.

In the embodiment, although the contact hole CC is provided on the second terrace 12, the contact hole CC is not provided on the first terraces 11. For example, the exposed regions 16 perform the role of the contact holes on the first terraces 11.

In the embodiment, the portions where the interconnects 14 and the columnar conductive bodies 18 are in contact are aligned with the upper surface of the second terrace 12 (the X-Y plane). Conversely, the portions where the interconnects 14 and the electrode layers 41 are in contact are aligned with a plane crossing the upper surface of the second terrace 12. For example, the portions where the interconnects 14 and the electrode layers 41 are in contact are aligned with the side surfaces of the electrode layers 41. For example, if the side surfaces of the electrode layers 41 are along the Y-Z plane, the exposed regions 16 are provided along the Y-Z plane. In the case where the exposed regions 16 are provided along the Y-Z plane, the widths in the X-direction of the exposed regions 16 are substantially "zero." Accordingly, the terrace width Wt1 of the first terrace 11 can be set to be narrower than the terrace width Wt2 of the second terrace 12. The terrace width Wt1 is set to be "1/a" of the terrace width Wt2. "a" is a number greater than 1. This is expressed by the formula $$Wt1 = Wt2/a. \tag{2}$$

For example, in the case where the terrace width Wt2 is about 300 nm, the terrace width Wt1 can be about 50 nm which is about ⅙ of the terrace width Wt2.

It is assumed that "Wt2=Wt2x." in such a case, the terrace width Wt1 of the first terrace 11 is $$Wt1 = Wt2x/a. \tag{3}$$

The total number of levels of the terraces $12x$ of the reference example is taken as "N." in such a case, a length Wsc along the X-direction of the stairstep portion 2 is $$Wsc = N \cdot Wt2x. \tag{4}$$

The total number of levels of the first terraces 11 of the embodiment is taken as "n;" and the total number of levels of the second terrace 12 is taken as "m." in such a case, the length Wsc along the X-direction of the stairstep portion 2 is $$Wsc = m \cdot Wt2x + (n \cdot Wt2x/a) \tag{5}$$
$$= (m + (n/a)) \cdot Wt2x.$$

As expressed in Formula (4) and Formula (5), for example, in the case where "n+m=N," comparing the embodiment to the reference example, the length Wsc along the X-direction of the stairstep portion 2 can be set to be short. Moreover, as expressed in Formula (5), the reduction effect of the length Wsc due to the semiconductor device of the embodiment increases as the total number of levels "N" of the terraces increases.

Thus, according to the embodiment, a semiconductor device in which it is possible to reduce the planar size of the stairstep portion 2 can be obtained.

<Example of Planar Pattern of Exposed Regions 16>

Figure 9:
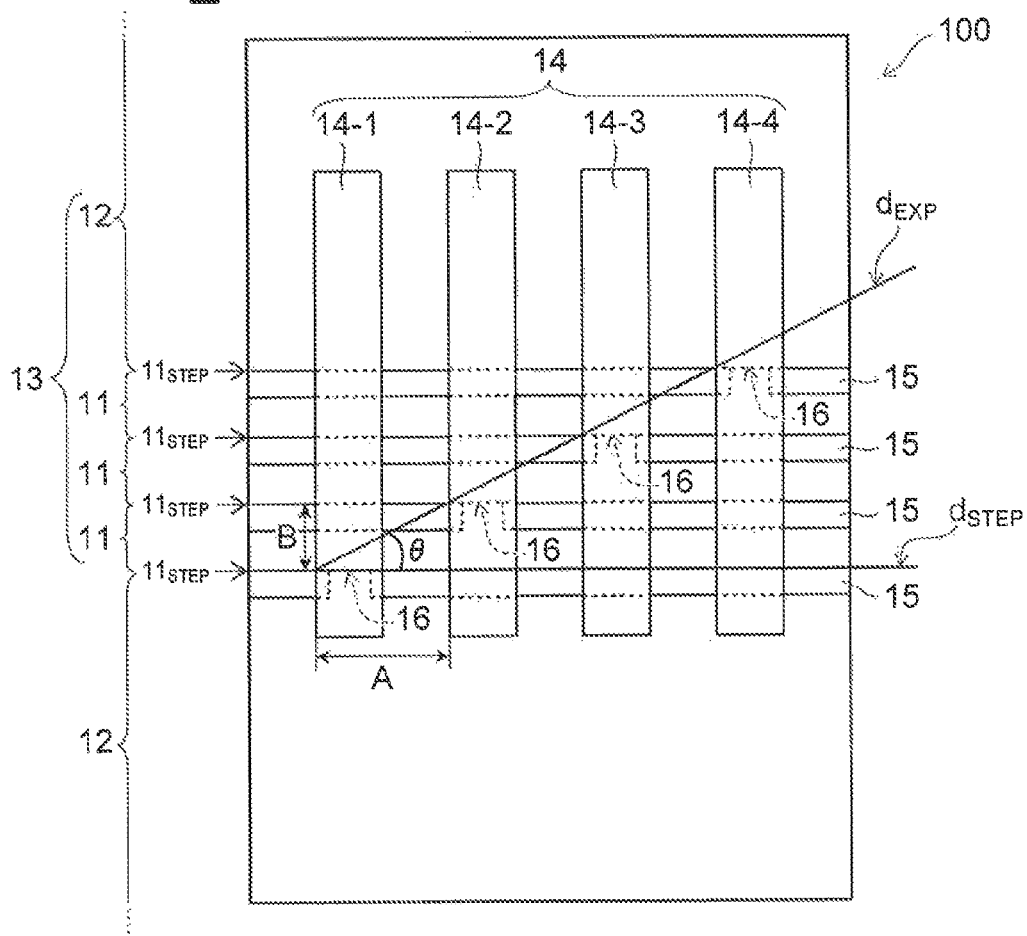
FIG. 9 and FIG. 10 are schematic plan views of the stairstep portion.
Figure 10:
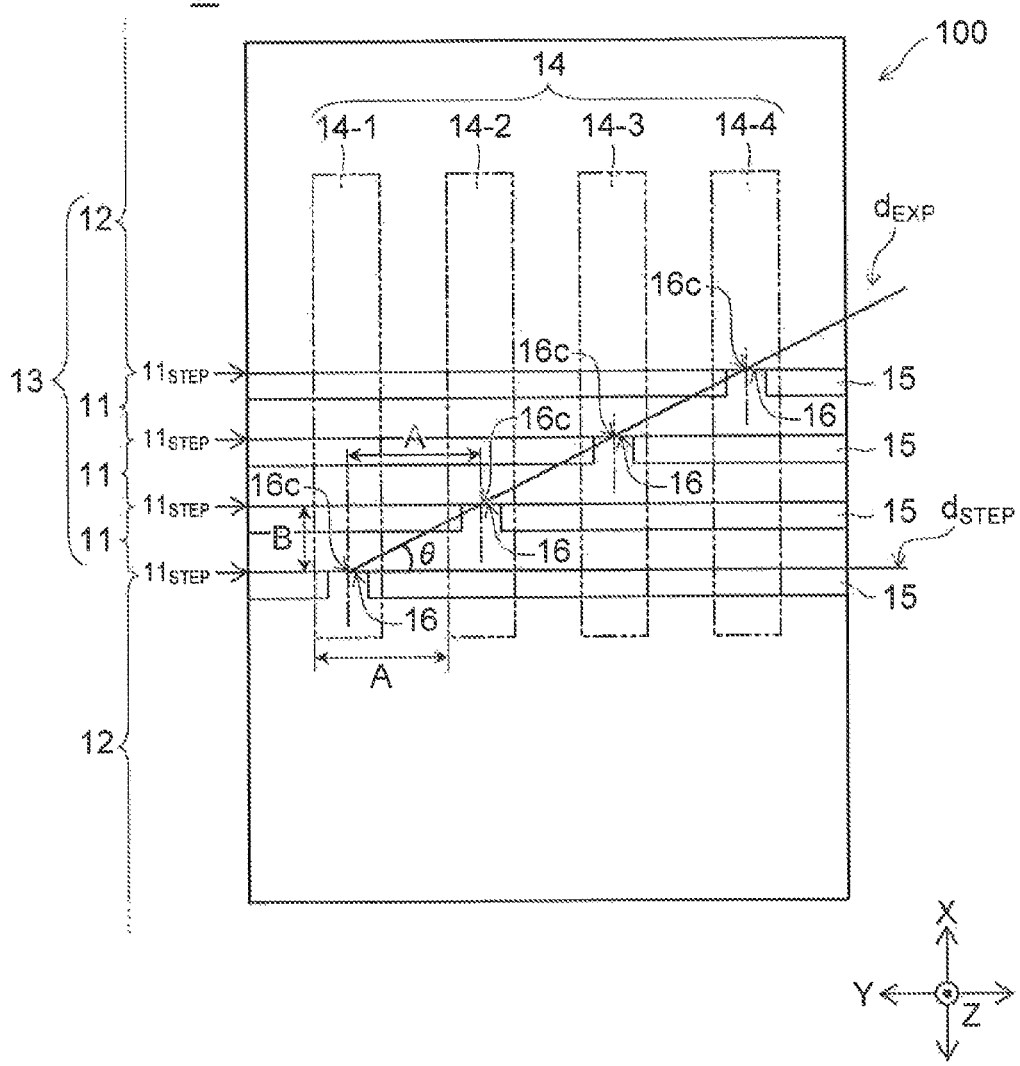

FIG. 9 and FIG. 10 are schematic plan views of the stairstep portion 2.

As shown in FIG. 9 and FIG. 10, when viewed in plan, the exposed regions 16 are disposed to be arranged linearly from the first terraces 11 to the second terrace 12 in a direction $d_{EXP}$ oblique to a direction $d_{STEP}$. The direction $d_{STEP}$ is the direction in which steps $11_{STEP}$ of the first terraces 11 extend. The direction $d_{EXP}$ is the direction in which the exposed regions 16 are arranged. For example, a relationship such as the following can be provided between the direction $d_{STEP}$ and the direction $d_{EXP}$.

The angle between the direction $d_{STEP}$ and the direction $d_{EXP}$ is taken as "θ;" the arrangement pitch of the interconnects 14 is taken as "A;" and the terrace width Wt1 of the first terrace 11 is taken as "B." in such a case, in the embodiment, the relationship $$\tan \theta = B/A \quad (6)$$

is satisfied.

For the exposed regions 16, the locations used as the reference of the direction $d_{EXP}$ are, for example, center positions 16c of portions along the direction $d_{STEP}$ as shown in FIG. 10. The straight line that connects each of the center positions 16c is taken as a direction $d_{EXPC}$. The distance along the direction $d_{STEP}$ between one of the center positions 16c and one of the center positions 16c adjacent to the one of the center positions 16c is equal to the arrangement pitch "A" of the interconnects 14. Accordingly, it is sufficient for the angle θ between the direction $d_{EXPC}$ and the direction $d_{EXP}$ to satisfy the relationship shown in Formula (6).

For the exposed regions 16, the locations that are used as the reference of the direction $d_{EXP}$ are not limited to the center positions 16c. For example, the locations that are used as the reference of the direction $d_{EXP}$ may be the boundary positions between the sidewall insulating films 15 and the exposed regions 16.

If the semiconductor device is a semiconductor device in which the relationship shown in Formula (6) is satisfied, the manufacturing method described below can be employed.

<Method for Manufacturing>

FIG. 11A to FIG. 11I are schematic plan views showing a method for manufacturing the semiconductor device of the embodiment. FIG. 12A to FIG. 12I are schematic cross-sectional views along line XII-XII of FIG. 11A to FIG. 11I.

1. Formation of Stacked Body 100

Figure 11A:
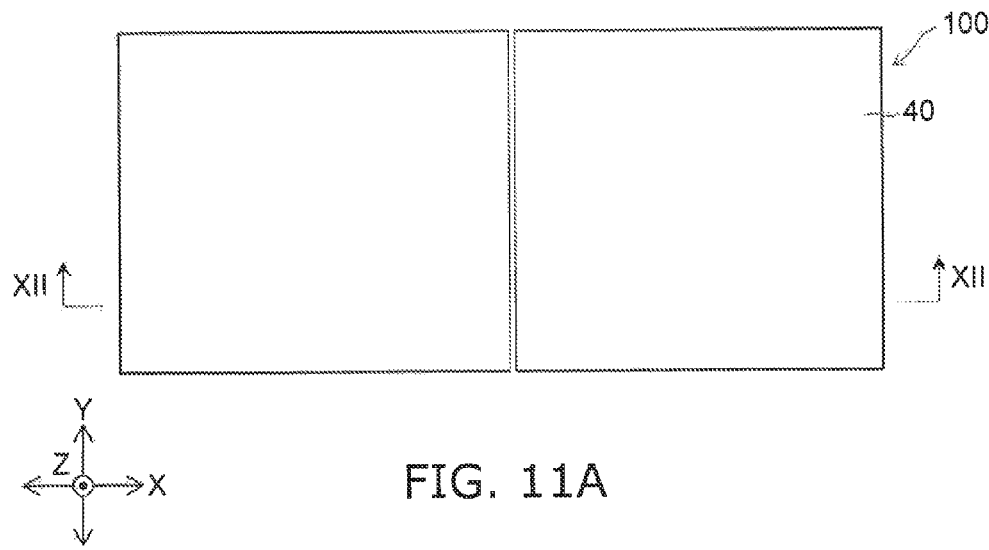
FIG. 11A to FIG. 11I are schematic plan views showing a method for manufacturing the semiconductor device of the embodiment.

As shown in FIG. 11A and FIG. 12A, for example, the stacked body 100 is formed on the major surface 10a of the substrate 10. Although the substrate 10 is not illustrated in FIG. 11A and FIG. 12A, the substrate 10 is shown in, for example, FIG. 2, FIG. 3, etc. The stacked body 100 is formed by alternately stacking the insulating bodies 40 and the electrode layers 41 on the major surface 10a. For example, an insulating material such as silicon oxide, etc., can be selected as the insulating bodies 40. For example, a semiconductor material such as polysilicon, etc., a metal material such as tungsten, molybdenum, etc., can be selected as the electrode layers 41.

2. Formation of Stairstep Portion 2

Figure 11B:
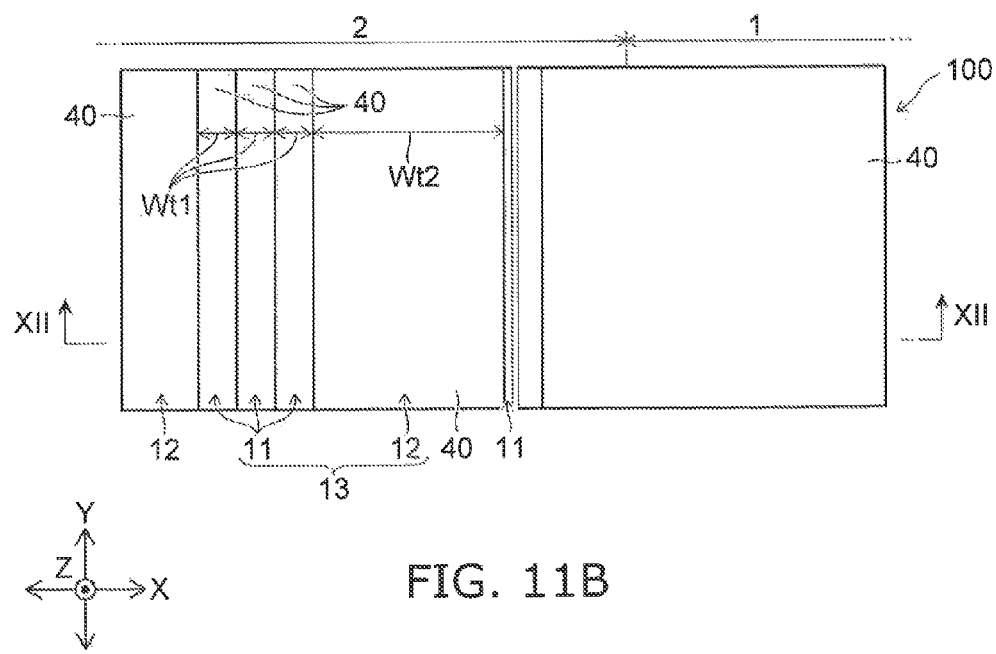

As shown in FIG. 11B and FIG. 12B, the stairstep portion 2 is formed in the end portion of the stacked body 100. It is sufficient for the formation of the stairstep portion 2 to be performed using a well-known method such as resist slimming, etc. In the stairstep portion 2, for example, the pairs of the insulating body 40 and the electrode layer 41 are made into a stairstep configuration one pair at a time. Inside one pair, the insulating body 40 is disposed on the front surface side for the first terraces 11 and the second terrace 12. The stairstep portion 2 is formed by causing the pair of the insulating body 40 and the electrode layer 41 to recede from the end portion of the stacked body 100 toward the inside one at a time by repeating anisotropic etching of the end portion of the stacked body 100 and slimming of the resist.

The terrace width Wt2 of the second terrace 12 is wider than the terrace width Wt1 of the first terrace 11. For example, the second terrace 12 can be formed by setting the slimming amount of the not-illustrated resist to be large compared to when the first terraces 11 are formed. Thereby, the stairstep portion 2 that has the structure bodies 13 including the multiple first terraces 11 and one second terrace 12 is formed at the periphery of the memory cell array 1.

Although substantially one structure body 13 is shown in FIG. 11B and FIG. 12B, the structure body 13 is multiply formed repeatedly in the stairstep portion 2 as shown in FIG. 4 and FIG. 5.

3. Formation of Sidewall Insulating Films 15

Figure 11C:
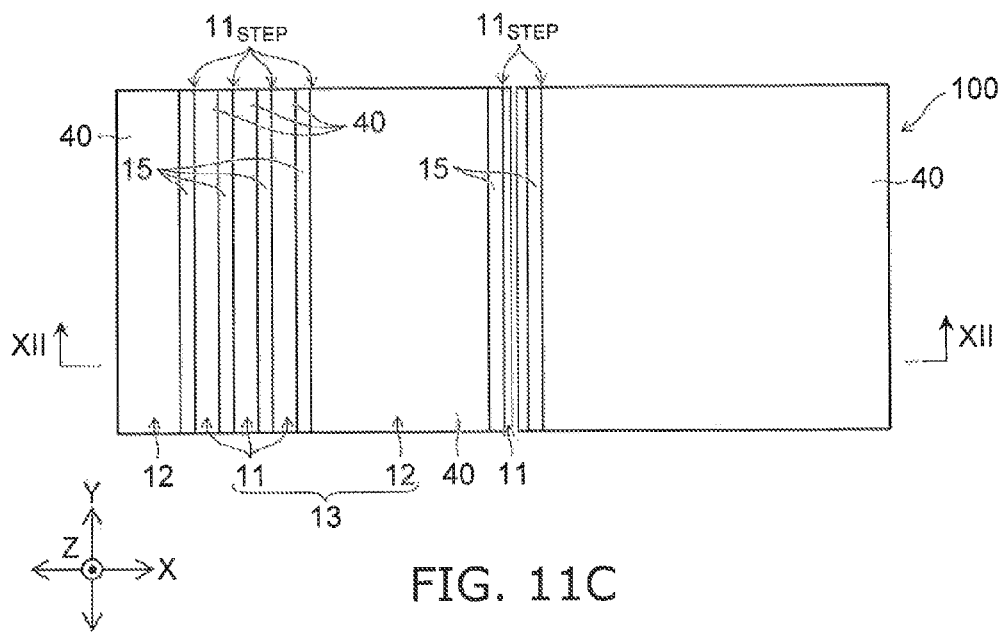
Figure 12C:
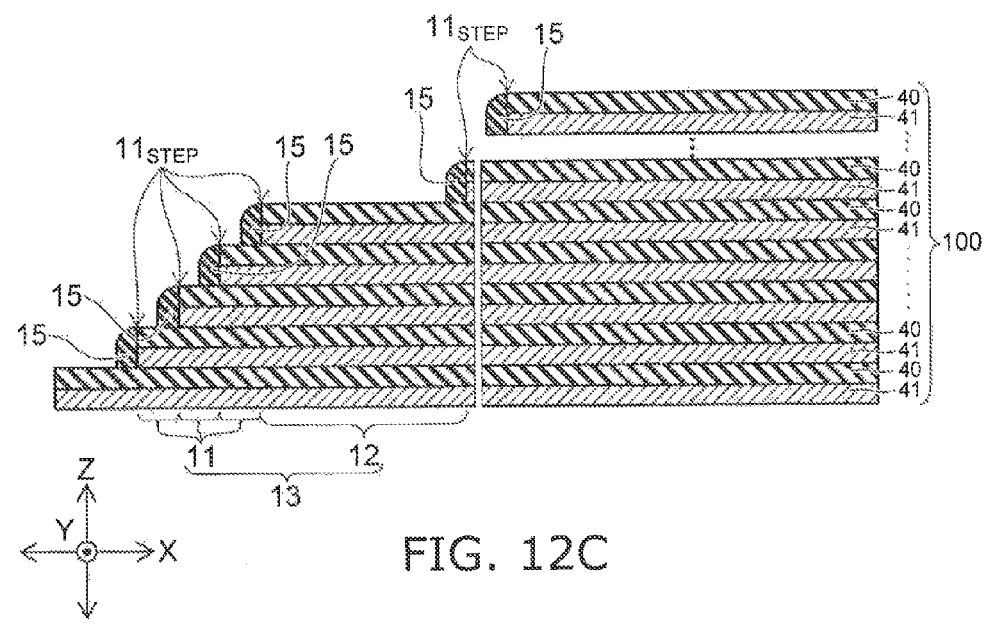

As shown in FIG. 11C and FIG. 12C, the sidewall insulating films 15 are formed from the tops of the first terraces 11 to the top of the second terrace 12. The sidewall insulating films 15 are formed as follows.

For example, a silicon nitride film is formed on the structure body 13 shown in FIG. 11B and FIG. 12B. The silicon nitride film is formed from the tops of the first terraces 11 to the top of the second terrace 12 by depositing silicon nitride to have, for example, a thickness that is half of the terrace width Wt1 of the first terrace 11. Then, anisotropic etching of the silicon nitride film is performed; and the silicon nitride film is caused to remain along the steps $11_{STEP}$. Thereby, the sidewall insulating films 15 are formed on the first terraces 11 and on the second terrace 12 along the steps $11_{STEP}$. By the sidewall insulating films 15 being formed, the peripheries of the electrode layers 41 are covered with the insulating bodies 40 and the sidewall insulating films 15.

4. Formation of Exposed Regions 16

Figure 11D:
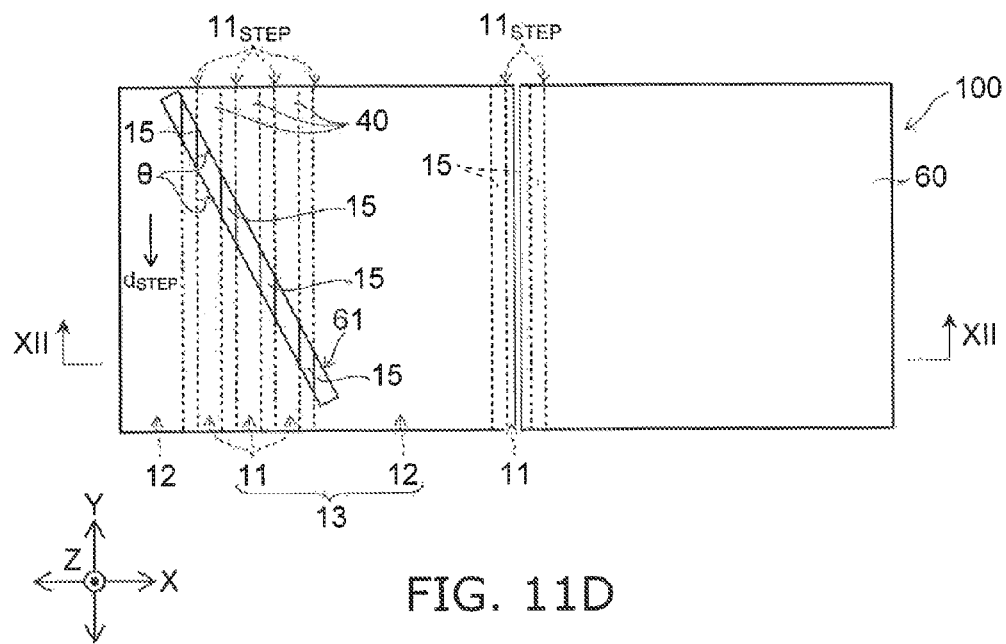
Figure 11E:
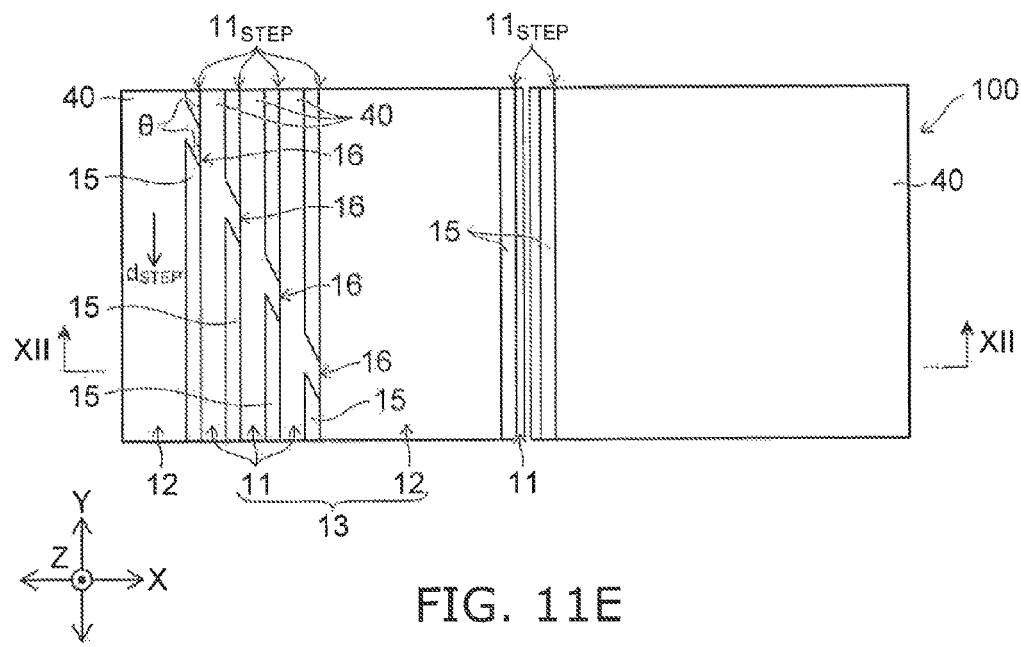
Figure 12D:
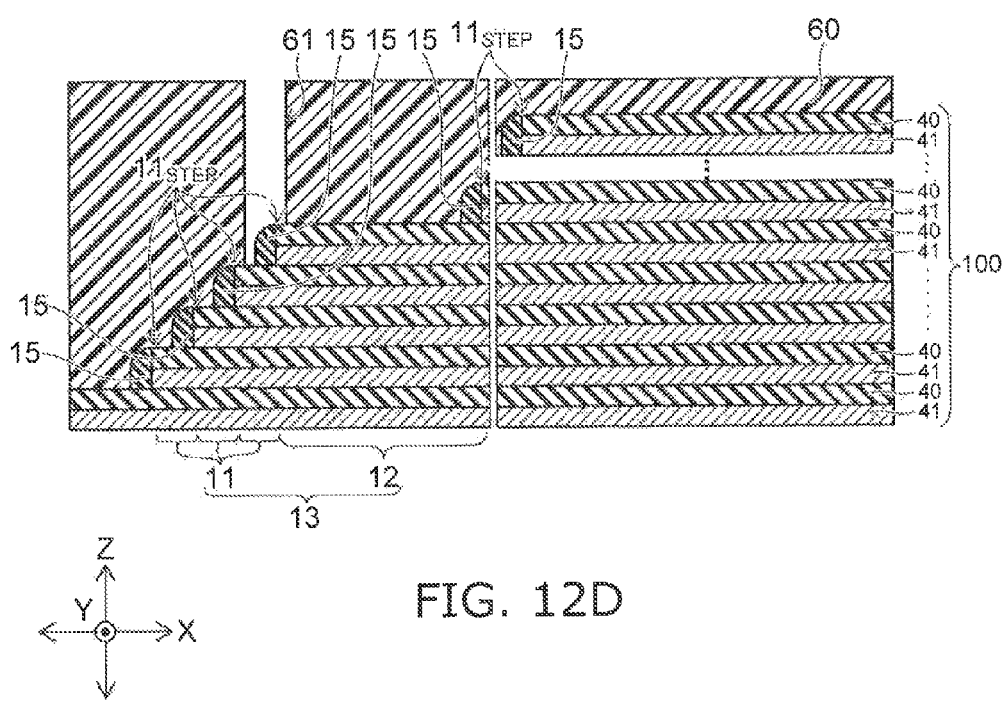
Figure 12E:
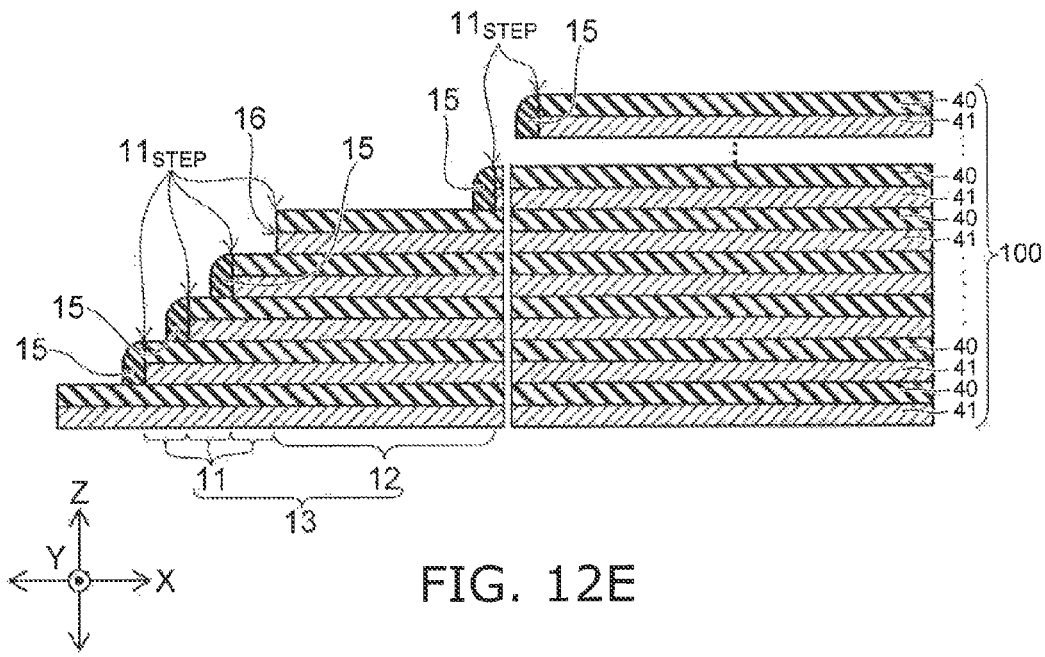

As shown in FIG. 11E and FIG. 12E, the exposed regions 16 where the side surfaces of the electrode layers 41 are exposed are formed in the sidewall insulating films 15. In the manufacturing method of the embodiment, the exposed regions 16 are formed as follows.

For example, a resist film 60 is formed on the structure body 13 shown in FIG. 11D and FIG. 12D. Then, a hole 61 is formed in the resist film 60 using photolithography. The hole 61 is formed in the resist film 60 to be tilted at the angle θ with respect to the direction $d_{STEP}$ in which the steps $11_{STEP}$ extend so that the multiple sidewall insulating films 15 are exposed. Then, the sidewall insulating films (including, for example, silicon nitride) 15 are selectively etched using the resist film 60 and the insulating bodies (including, for example, silicon oxide) 40 exposed at the bottom of the hole 61 as a mask. Thereby, as shown in FIG. 11E and FIG. 12E, the exposed regions 16 are formed in the sidewall insulating films 15. The side surfaces of the exposed regions 16 formed by such a method are tilted at the angle θ with respect to the direction $d_{STEP}$ in which the steps $11_{STEP}$ extend. The angle θ satisfies the relationship of Formula (6) described above.

It is also possible to form the exposed regions 16 using a resist film that has multiple holes corresponding to each one of the multiple exposed regions 16. However, the exposed regions 16 are fine. Therefore, a pattern in which fine holes are multiply arranged in a series is formed in the resist film. For example, in the case where the pattern in which the fine holes are multiply arranged in a series is formed using photolithography, interference of the light may occur; and it may become difficult to form the multiple holes with uniform sizes. If the size of the holes fluctuates, the planar size of the exposed regions 16 fluctuates. For example, the fluctuation of the planar size of the exposed regions 16 may cause an enlargement of the fluctuation of the contact resistance between the interconnects 14 and the electrode layers 41 formed subsequently.

Conversely, in the manufacturing method of the embodiment, one hole 61 that corresponds to the multiple exposed regions 16 arranged in a series is formed in the resist film 60 and tilted at the angle θ with respect to the direction $d_{STEP}$. Therefore, compared to the case where the multiple holes corresponding to each one of the multiple exposed regions 16 arranged in a series are formed in the resist film 60, the effects of the "interference of the light" can be reduced.

Accordingly, according to the manufacturing method of the embodiment, for example, it is easier to multiply form the exposed regions 16 having uniform planar sizes by one etching process. Thereby, for example, it is possible to suppress the fluctuation to be small for the contact resistance between the interconnects 14 and the electrode layers 41 formed subsequently.

5. Formation of Interconnects 14

Figure 11F:
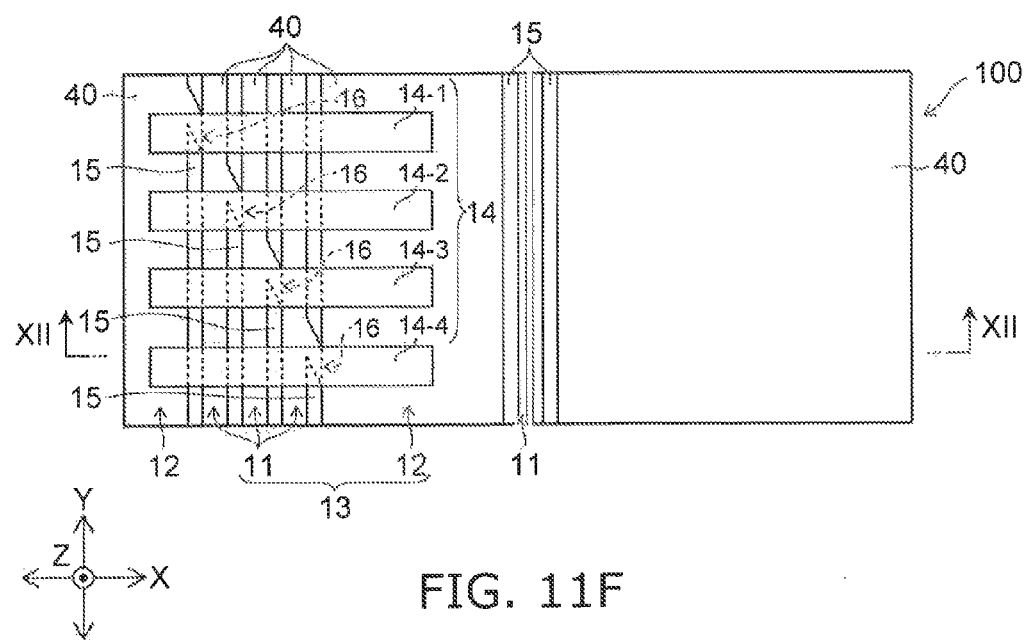
Figure 12F:
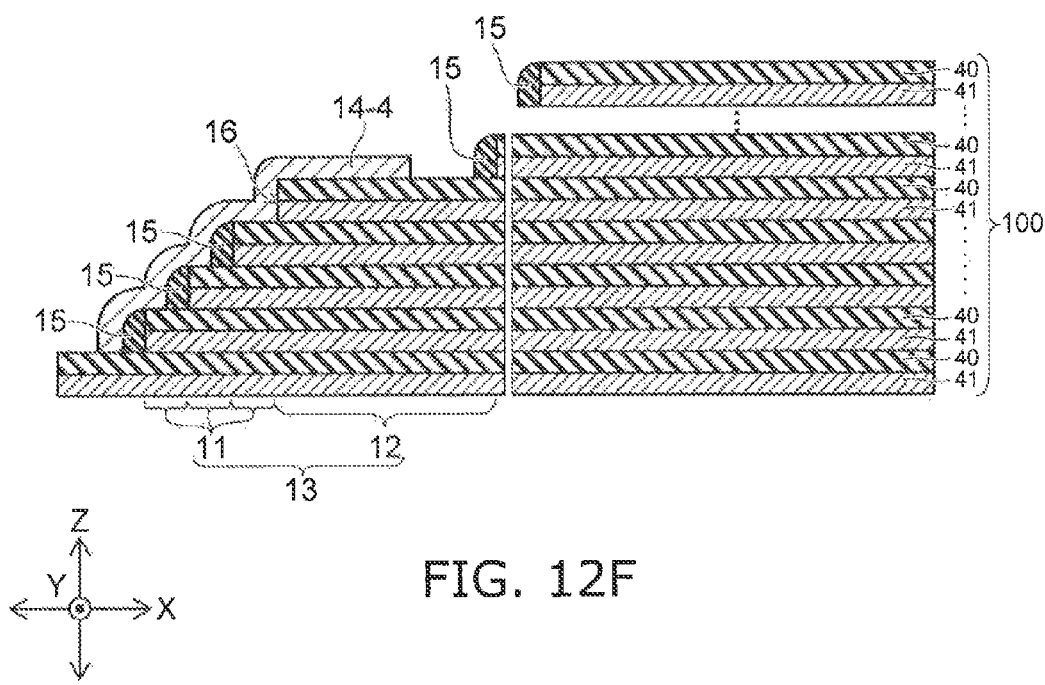

As shown in FIG. 11F and FIG. 12F, the multiple interconnects 14 (14-1 to 14-4) are formed from the second terrace 12 to the multiple first terraces 11. The interconnects 14 contact the electrode layers 41 via the exposed regions 16. The interconnects 14 are formed by forming a conductive film, e.g., a metal film including a metal such as tungsten, etc., on the structure body 13 shown in FIG. 11E and FIG. 12E and then patterning the metal film into rectangular configurations when viewed in plan using photolithography.

6. Formation of Insulating Film 17

Figure 11G:
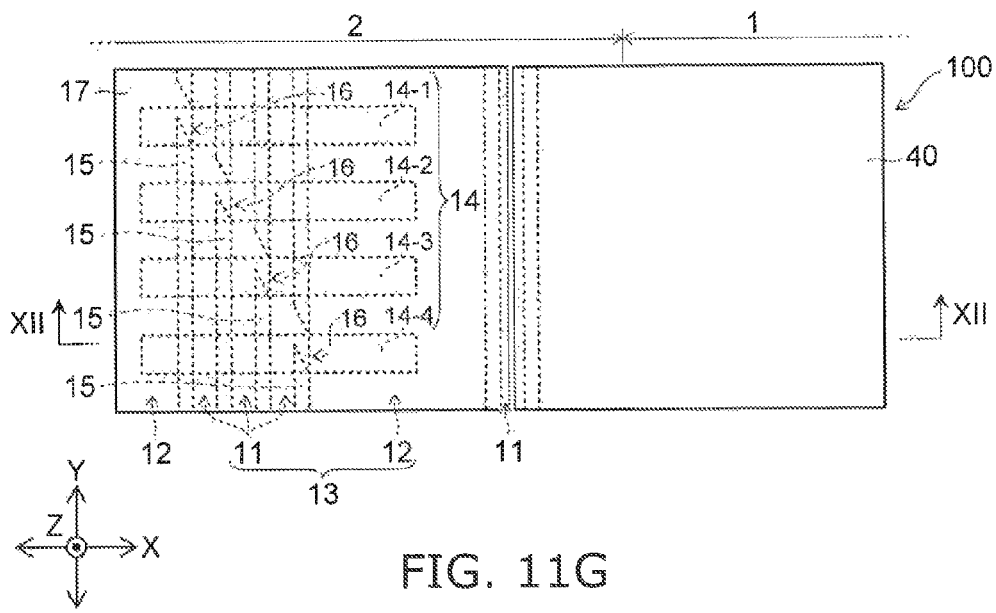
Figure 12G:
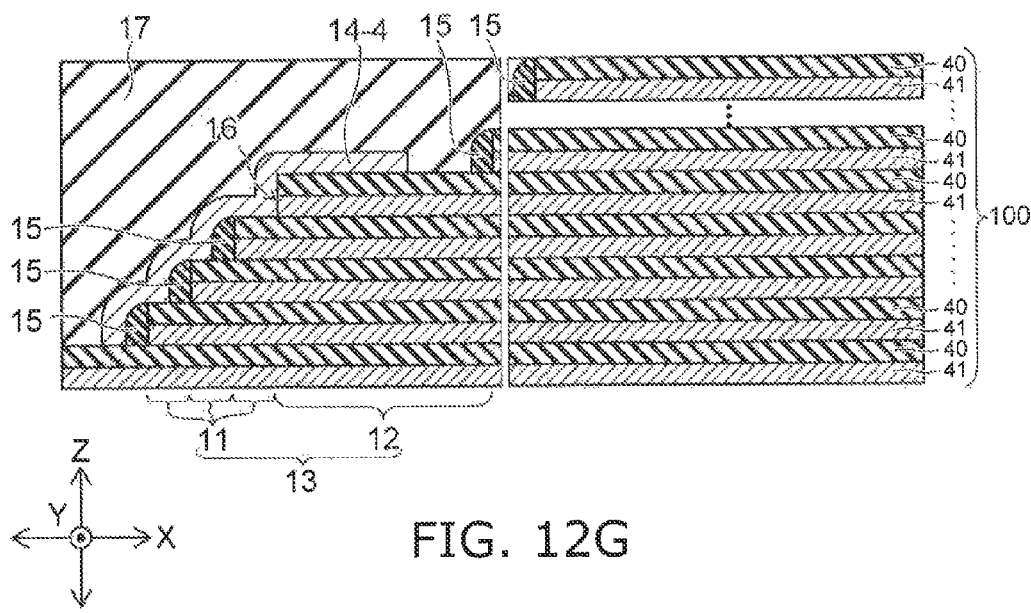

As shown in FIG. 11G and FIG. 12G, the insulating film 17 is formed on the stairstep portion 2; and the recess formed in the stairstep portion 2 is filled. The insulating film 17 is formed by forming an insulating film, e.g., an insulating film including silicon oxide, on the structure body 13 shown in FIG. 11F and FIG. 12F and then planarizing the insulating film to fill the recess formed in the stairstep portion 2 using CMP.

7. Formation of Columnar Units CL

Figure 11H:
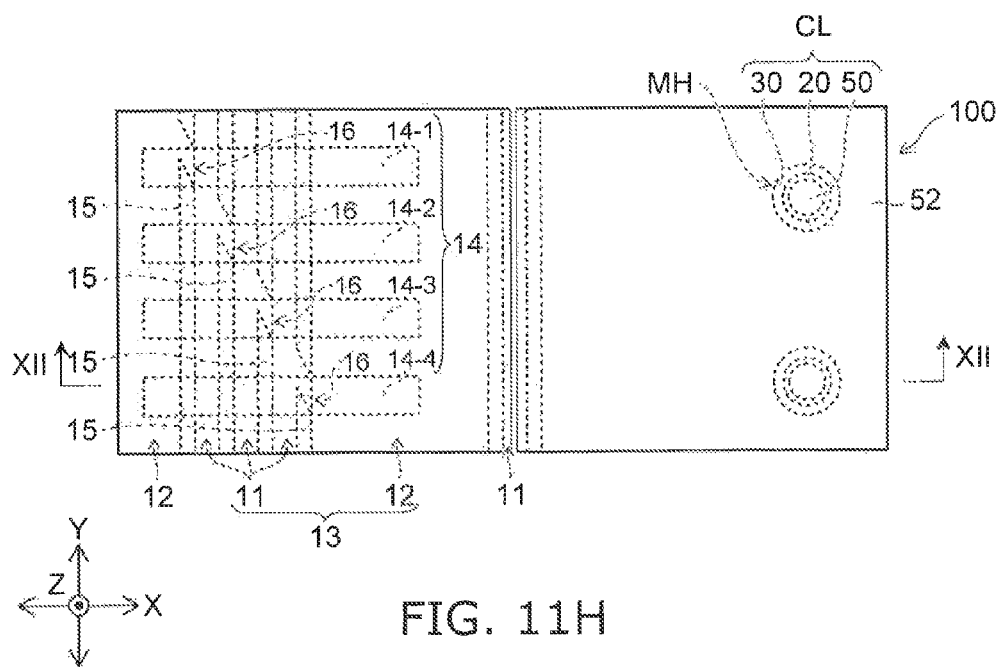
Figure 12H:
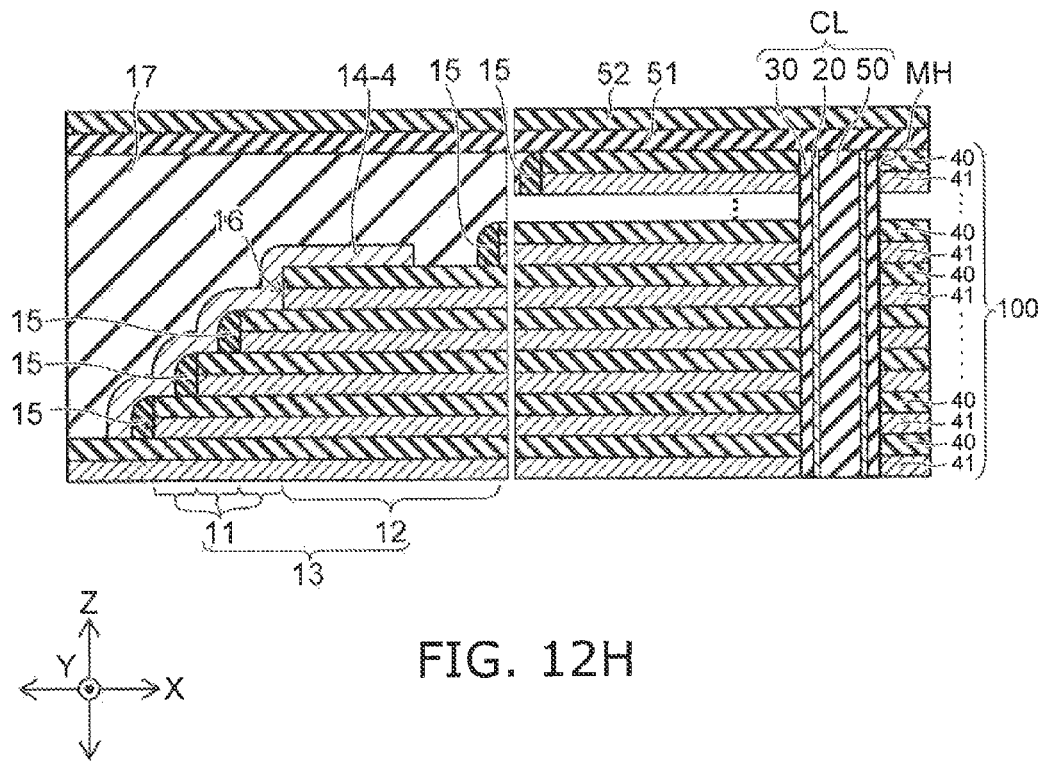

As shown in FIG. 11H and FIG. 12H, the columnar units CL that extend in the Z-direction are formed inside the stacked body 100. For example, in the case where the columnar units CL such as that shown in FIG. 3 are formed, summarily, it is sufficient to perform the following processes.

As shown in FIG. 3, the memory hole MH is formed inside the stacked body 100. For example, the memory hole MH is formed to reach the substrate 10. Then, the semiconductor pillar 10b is formed on the substrate 10 exposed at the bottom of the memory hole MH using, for example, CVD. For example, the semiconductor pillar 10b is formed on the substrate 10 up to the insulating body 40 between the source-side selection gate SGS and the word line WL. Then, the memory film 30 is formed inside the memory hole MH. Then, the front surface of the semiconductor pillar 10b is exposed by etching the bottom of the memory film 30. Then, the semiconductor body 20 is formed. Then, the memory hole MH is filled by forming the core layer 50. Thus, the columnar unit CL is formed inside the memory hole MH.

Subsequently, an insulating film 51 that includes silicon oxide is formed on the insulating film 17, the sidewall insulating films 15, the insulating bodies 40, and the columnar units CL. Thereby, the columnar units CL are covered with the insulating film 51. Then, the slit ST is formed inside the stacked body 100. Then, an insulating film is formed on the side wall of the slit ST. Then, the source line SL is formed inside the slit ST in which the insulating film is formed. Then, an insulating film 52 is formed on the insulating film 51, the sidewall insulating film, and the source line SL. Thereby, the source line SL is covered with the insulating film 52. For example, the slit ST and the source line SL are shown in FIG. 2, etc.

8. Formation of Columnar Conductive Bodies 18

Figure 11I:
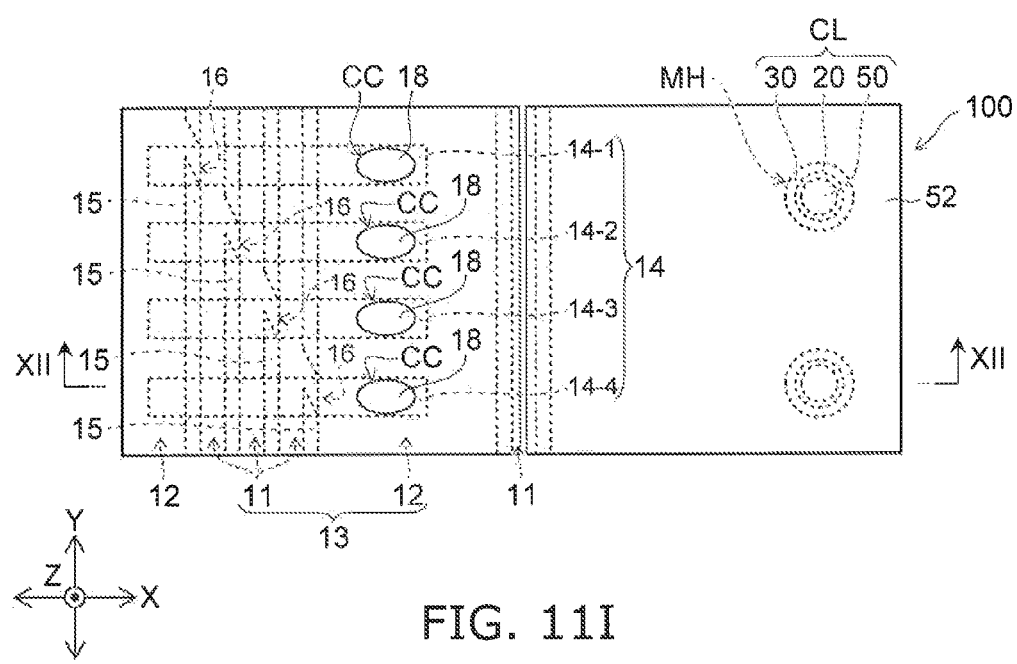
Figure 12I:
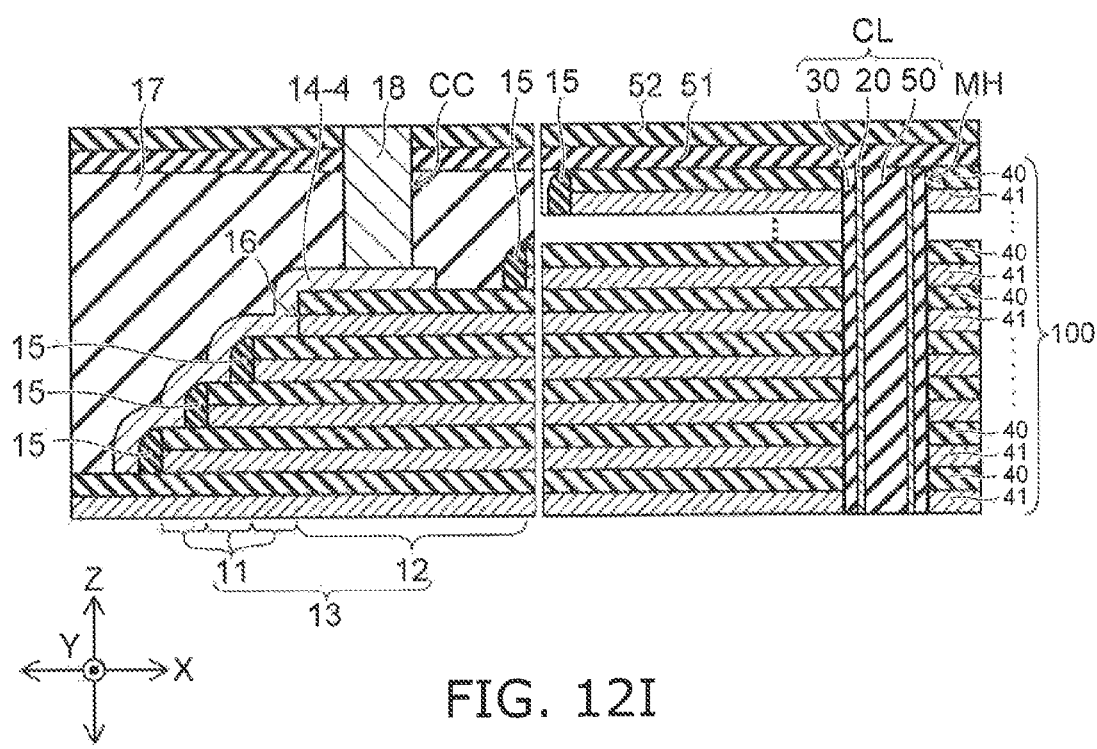

As shown in FIG. 11I and FIG. 12I, the multiple columnar conductive bodies 18 are formed on the second terrace 12. The columnar conductive bodies 18 are formed by forming the contact holes CC reaching the interconnects 14 in the Z-direction inside the insulating film 52, the insulating film 51, and the insulating film 17 and by filling a conductor, e.g., a metal such as tungsten, etc., inside the contact holes CC.

Subsequently, although not particularly illustrated, for example, an insulating film is formed on the insulating film 52 and the columnar conductive bodies 18; holes that reach the columnar units CL, the source line SL, the columnar conductive bodies 18, etc., are formed; and the bit lines BL, the shunt interconnect 80, the interconnects 81, etc., are formed for the semiconductor device.

For example, the semiconductor device of the embodiment can be manufactured by the manufacturing method shown in FIG. 11A to FIG. 11I and FIG. 12A to FIG. 12I.

Moreover, according to the manufacturing method shown in FIG. 11A to FIG. 11I and FIG. 12A to FIG. 12I, the one hole 61 that corresponds to the multiple exposed regions 16 arranged in a series is formed in the resist film 60 to be tilted at the angle θ with respect to the direction $d_{STEP}$. According to such a manufacturing method, for example, compared to the case where multiple holes corresponding to each one of the multiple exposed regions 16 arranged in a series are formed in the resist film 60, the advantage can be obtained that the fluctuation of the contact resistance between the interconnects 14 and the electrode layers 41 can be suppressed to be small.

<Example of Planar Pattern of Stairstep Portion 2>

First Example

Figure 13:
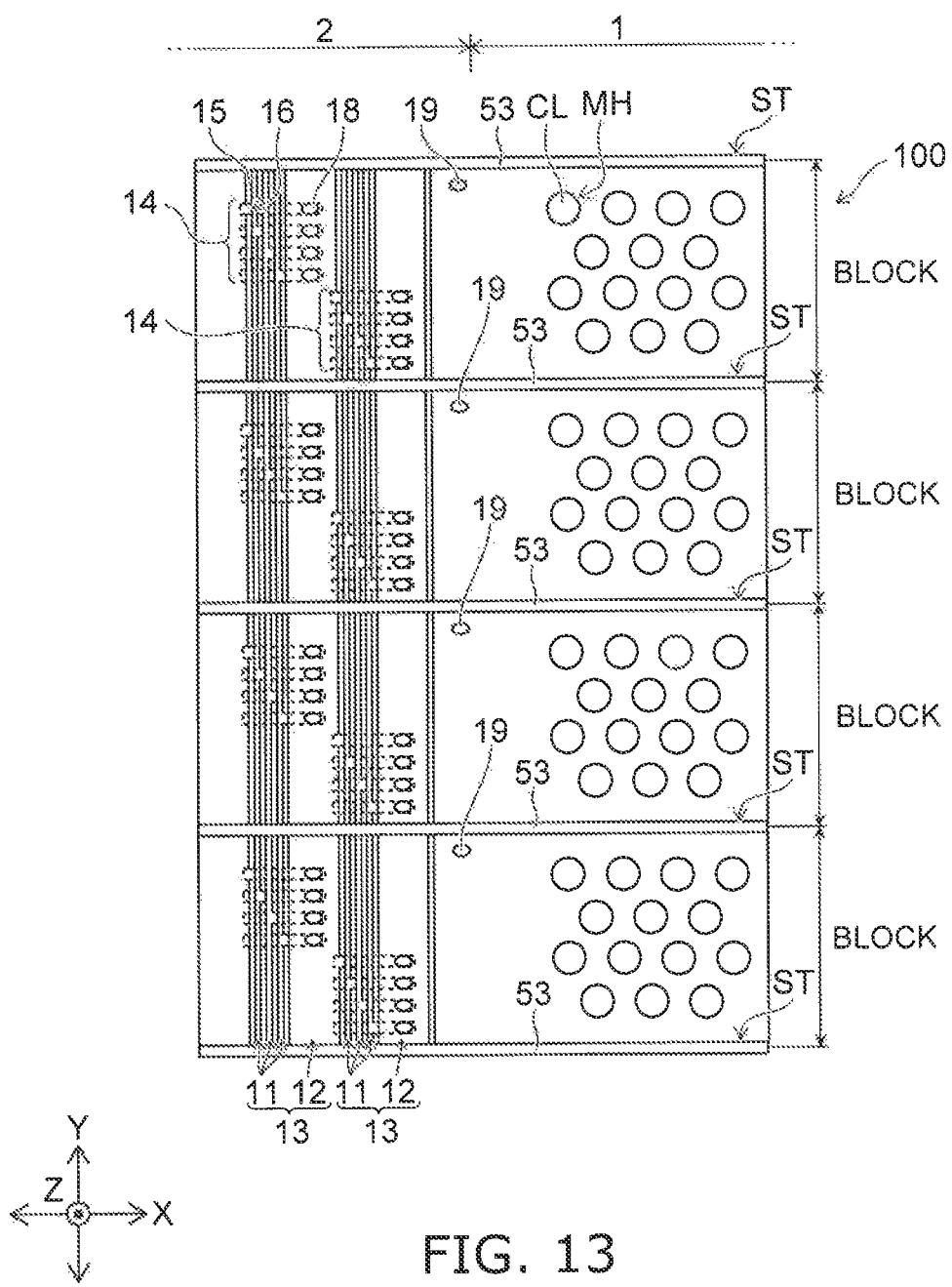
FIG. 13 is a schematic plan view showing a first example of the planar pattern of the semiconductor device of the embodiment.

FIG. 13 is a schematic plan view showing a first example of the planar pattern of the semiconductor device of the embodiment.

In the stacked body 100 as shown in FIG. 13, the region interposed between two slits ST is called a "block." Four blocks are shown in FIG. 13. The slits ST are formed from end to end of the stacked body 100; and the lower ends of the slits ST reach, for example, the substrate 10.

Insulating films 53 are formed inside the slits ST. The source lines SL are formed inside the insulating films 53. The source lines SL are not illustrated in FIG. 13. The electrode layers 41 of the blocks are electrically isolated from each other by the insulating films 53. The electrode layers 41 that are used as the drain-side selection gates SGD (referring to FIG. 2) are drawn out from the memory cell array 1 to the stairstep portion 2 and are connected to columnar conductive bodies 19 in the drawn out region as shown in FIG. 13. For example, signals that drive the electrode layers 41 used as the drain-side selection gates SGD from the row control circuit 200 shown in FIG. 7 are conducted to the columnar conductive bodies 19 via interconnects that are not illustrated in FIG. 13.

The blocks each are electrically independent of each other. Therefore, as shown in FIG. 13, for example, the interconnects 14, the exposed regions 16, the columnar conductive bodies 18, and the columnar conductive bodies 19 that have the same planar pattern are provided repeatedly in the stairstep portion 2 in each of the blocks.

For example, the planar pattern of the stairstep portion 2 of the semiconductor device of the embodiment can be a pattern such as that shown in FIG. 13.

Second Example

Figure 14:
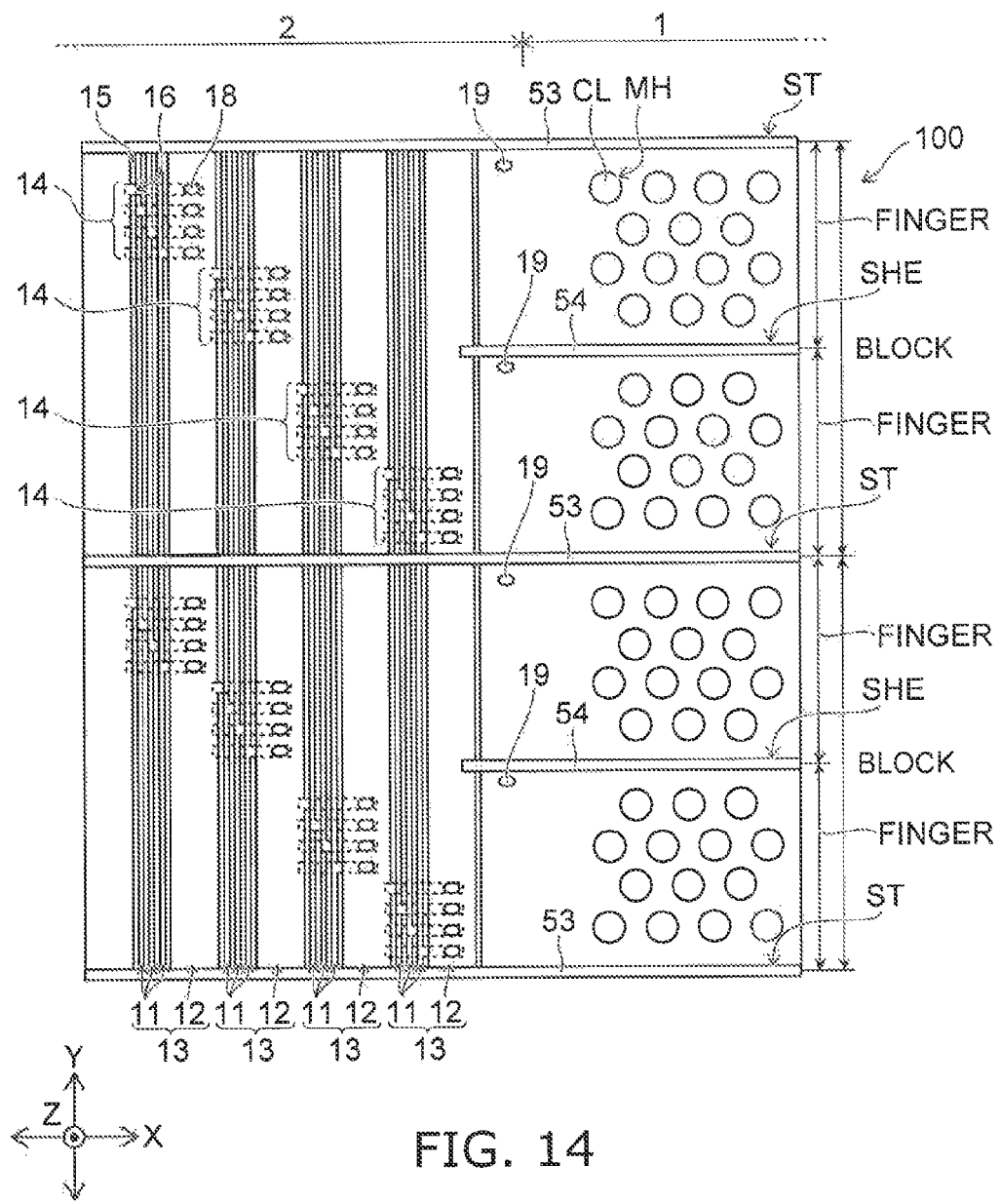
FIG. 14 is a schematic plan view showing a second example of the planar pattern of the semiconductor device of the embodiment.

FIG. 14 is a schematic plan view showing a second example of the planar pattern of the semiconductor device of the embodiment.

For example, in the case where a planar pattern such as that shown in FIG. 13 is employed for the interconnects 14, the number of the electrode layers 41 stackable in the stacked body 100 is roughly dependent on the number of the interconnects 81 (referring to FIG. 7) arrangeable within the range of the length in the Y-direction of one block. Therefore, in the case where it is desired to increase the number of the electrode layers 41 stacked in the stacked body 100, for example, it is sufficient to set the "length in the Y-direction of one block" to be long. One example is shown in FIG. 14 in which the "length in the Y-direction of one block" is set to be long.

In the second example shown in FIG. 14, a slit SHE that is short is provided inside one block. Similarly to the slit ST, the short slit SHE extends along the X-direction. The length in the X-direction of the short slit SHE is shorter than the slit ST. The short slit SHE is formed inside the stacked body 100 to divide the electrode layer 41 used as the drain-side selection gate SGD along the X-direction. The depth in the Z-direction of the short slit SHE may stop at the portion of the electrode layer 41 used as the drain-side selection gate SGD or may reach the substrate 10. An insulating film 54 is formed inside the short slit SHE. The region interposed between the slit ST and the short slit SHE is called a "finger." For example, the columnar conductive body 19 that conducts the signal driving the electrode layer 41 used as the drain-side selection gate SGD is provided for every "finger."

In the second example, the short slit SHE is provided inside the block. Therefore, compared to the case where the short slit SHE is not provided, the "length in the Y-direction of one block" can be set to be long. Therefore, the number of the interconnects 81 (referring to FIG. 7) that can be disposed inside one block can be increased. Accordingly, compared to the case where the short slit SHE is not provided, the number of the electrode layers 41 stacked in the stacked body 100 can be increased.

In the semiconductor device of the embodiment, from Formula (5) described above, the reduction effect of the length Wsc along the X-direction of the stairstep portion 2 increases as the number of stacked electrode layers 41 increases and the total number of levels of terraces increases. Accordingly, for example, the semiconductor device of the embodiment can be applied more effectively in a semiconductor device in which the number of stacks of the electrode layers 41 is increased and the short slit SHE such as that shown in FIG. 14 is provided.

Third Example

Figure 15:
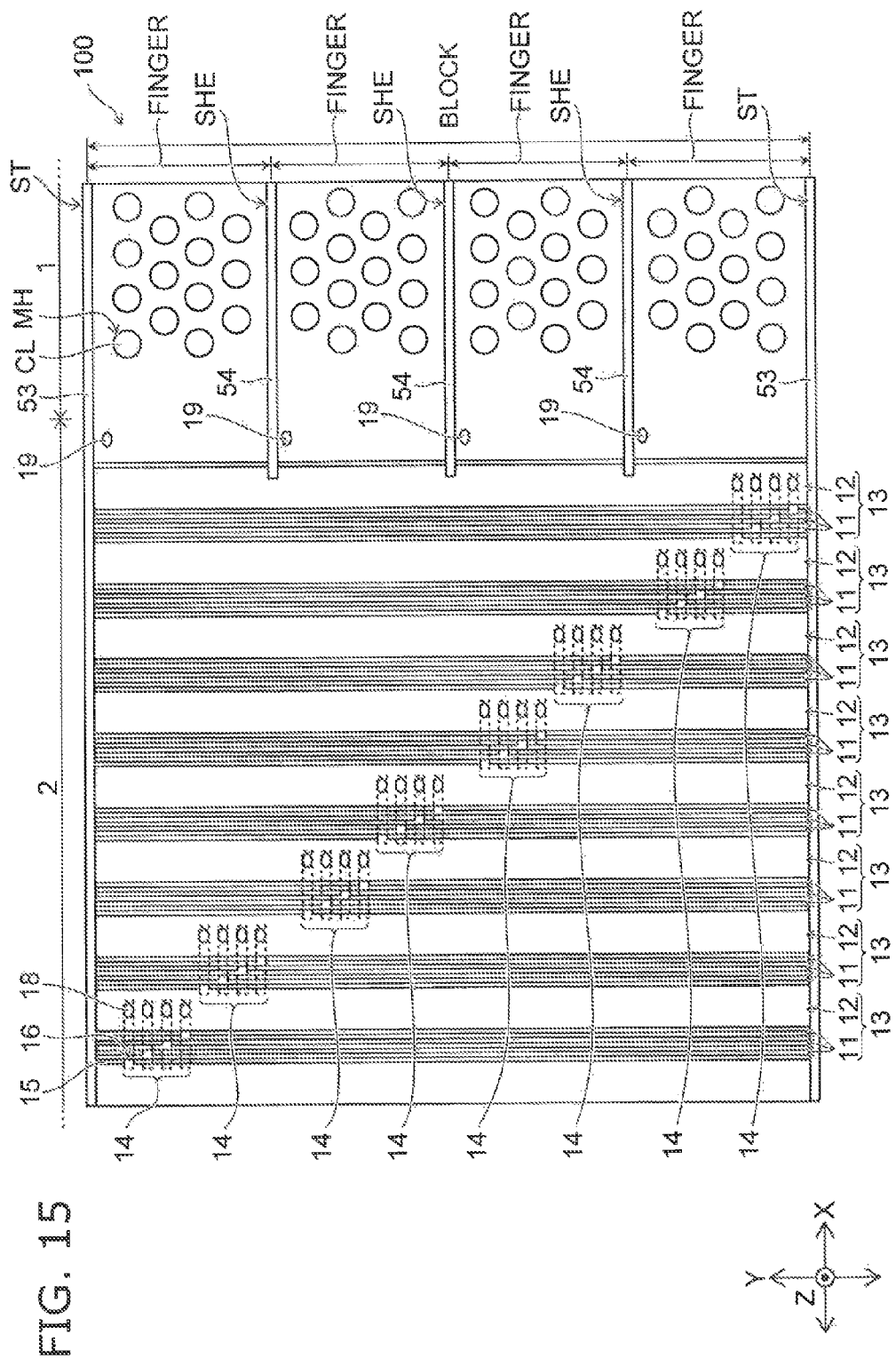
FIG. 15 is a schematic plan view showing a third example of the planar pattern of the semiconductor device of the embodiment.

FIG. 15 is a schematic plan view showing a third example of the planar pattern of the semiconductor device of the embodiment.

As shown in FIG. 15, the third example is an example in which the number of the short slits SHE provided inside one block is increased further compared to the second example shown in FIG. 14. In the third example, three short slits SHE are provided inside one block.

There are mainly two methods for the method for forming the electrode layers 41. One is a method called "replace." in "replace," sacrificial layers are formed between the insulating body 40 and the insulating body 40; and after forming the slits ST, the sacrificial layers are replaced with the electrode layers 41 via the slits ST.

The other one is a method in which the electrode layers 41 are preformed between the insulating body 40 and the insulating body 40. For example, this method is the method shown in FIG. 11A to FIG. 11I and FIG. 12A to FIG. 12I.

In the case where "replace" is used, the sacrificial layers are replaced with the electrode layers 41 via the slits ST. Therefore, the number of the short slits SHE that can be disposed inside one block is limited. Realistically as shown in FIG. 14, the number of the short slits SHE that can be disposed inside one block is "one."

Conversely, in the method in which the electrode layers 41 are preformed between the insulating body 40 and the insulating body 40, the "replace" is not performed; therefore, the number of the short slits SHE that can be disposed inside one block is not limited. Therefore, the number of the short slits SHE that can be disposed inside one block can be more than "one."

By setting the number of the short slits SHE to be more than "one" as in the third example, the "length in the Y-direction of one block" can be set to be longer. Accordingly, it is possible to further increase the number of the electrode layers 41 stacked in the stacked body 100 compared to the second example.

For example, the semiconductor device of the embodiment can be applied more effectively to a semiconductor device such as that shown in FIG. 15 in which it is possible to accommodate a further increase of the number of stacks of the electrode layers 41 by providing more than "one" short slit SHE inside one block.

Fourth Example

Figure 16:
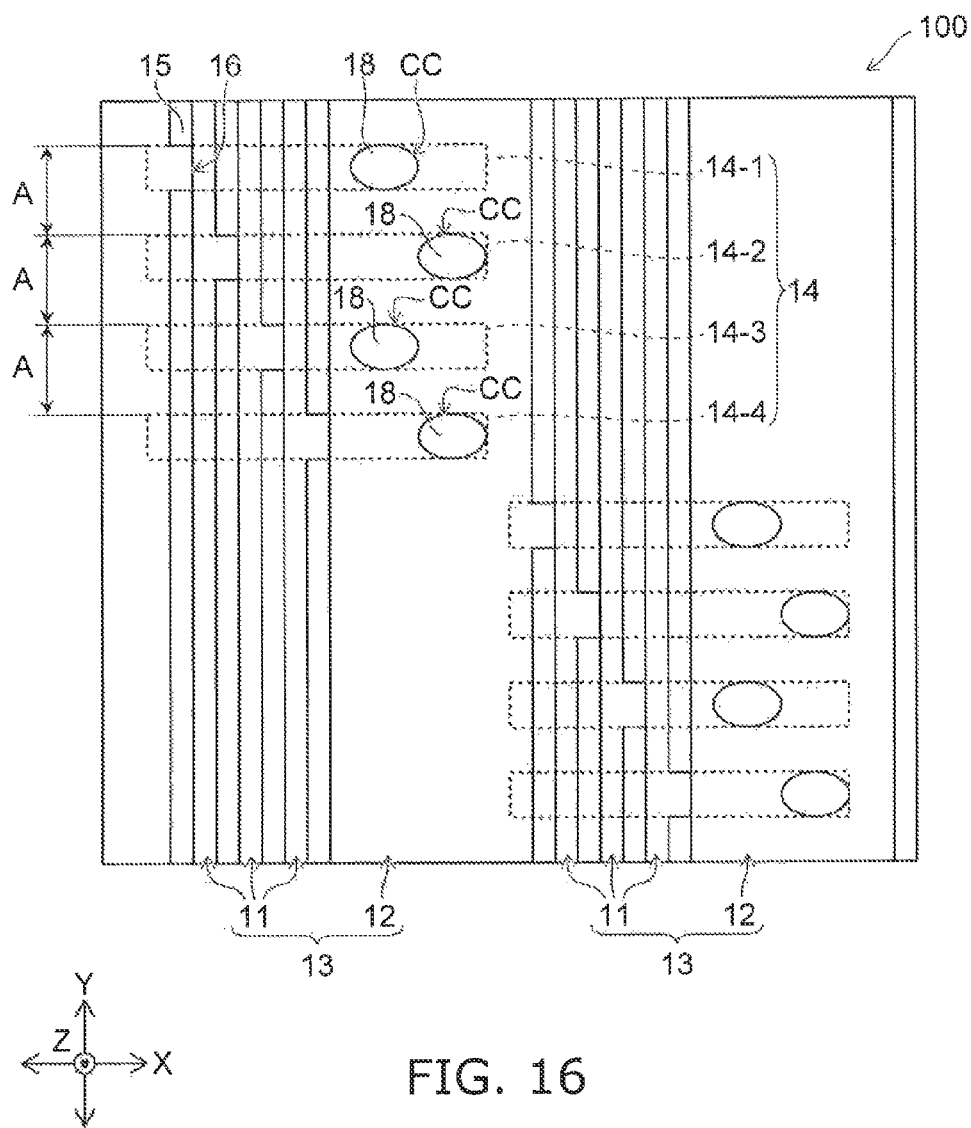
FIG. 16 is a schematic plan view showing a fourth example of the planar pattern of the semiconductor device of the embodiment.

FIG. 16 is a schematic plan view showing a fourth example of the planar pattern of the semiconductor device of the embodiment.

For example, as downscaling advances and the arrangement pitch A of the interconnects 14 becomes narrow, it becomes difficult to dispose the contact holes CC in one column in the Y-direction.

In such a case, as shown in FIG. 16, for example, the contact holes CC may be arranged in two columns in the Y-direction; and the contact holes CC may be arranged to be shifted alternately. In the specification, the arrangement of the contact holes CC shown in FIG. 16 is called a "staggered arrangement." in the fourth example in which the contact holes CC are arranged in the staggered configuration, the columnar conductive bodies 18 are arranged in the staggered configuration on the second terrace 12.

According to the fourth example, the columnar conductive bodies 18 are arranged in the staggered configuration on the second terrace 12. Thereby, for example, even in the case where the arrangement pitch A of the interconnects 14 becomes narrow, the advantage can be obtained that the multiple columnar conductive bodies 18 can be disposed on the second terrace 12.

Fifth Example

Figure 17:
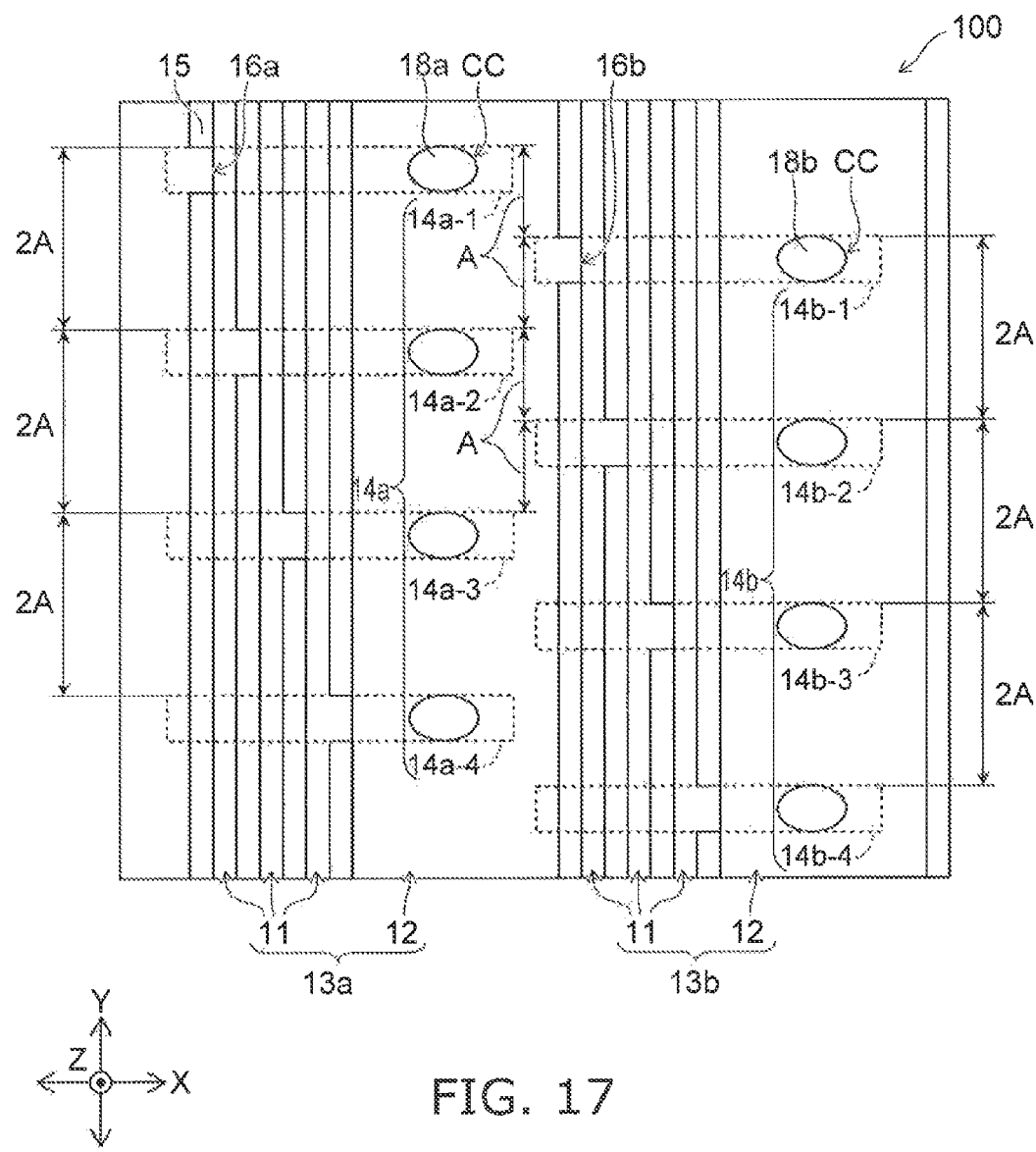
FIG. 17 is a schematic plan view showing a fifth example of the planar pattern of the semiconductor device of the embodiment.

FIG. 17 is a schematic plan view showing a fifth example of the planar pattern of the semiconductor device of the embodiment.

In the embodiment described above, the interconnects 14, the exposed regions 16, and the columnar conductive bodies 18 are disposed collectively in every one structure body 13. However, it is unnecessary to dispose the interconnects 14, the exposed regions 16, and the columnar conductive bodies 18 collectively in every one structure body 13.

As shown in FIG. 17, two structure bodies 13 are taken as a first structure body 13a and a second structure body 13b. In the fifth example, for example, interconnects 14a (14a-1 to 14a-4), exposed regions 16a, and columnar conductive bodies 18a included in the first structure body 13a and interconnects 14b (14b-1 to 14b-4), exposed regions 16b, and columnar conductive bodies 18b included in the second structure body 13b are arranged in a staggered configuration.

According to such a fifth example, for example, the interconnects 14b of the second structure body 13b are disposed to correspond to the spaces extending in the X-direction between the interconnects 14a of the first structure body 13a.

For example, the arrangement pitch between the interconnect 14a and the interconnect 14b is taken as "A." For example, the value of "A" is the same as the arrangement pitch "A" of the fourth example. In the fifth example, the interconnects 14a and the interconnects 14b are arranged alternately between the first structure body 13a and the second structure body 13b. Therefore, the arrangement pitch of the interconnects 14a is 2 times, i.e., "2A." Similarly, the arrangement pitch of the interconnects 14b also is 2 times, i.e., "2A."

Thus, according to the fifth example, for example, the interconnects 14 that are included in the other structure body 13 are arranged to correspond to the spaces extending in the X-direction between the interconnects 14 included in the one structure body 13. By using such an arrangement, the arrangement pitch of the interconnects 14 included in one structure body 13 can be enlarged. Accordingly, for example, the advantage can be obtained that it becomes easier to arrange the multiple columnar conductive bodies 18 on the second terrace 12.

Further, according to the fifth example, the pitch between the exposed regions 16 also is enlarged from, for example, "A" to "2A." Therefore, in the case where a process is implemented to form the multiple holes corresponding to each one of the exposed regions 16 in the resist film 60, the advantage can be obtained that the effects of the "interference of the light" can be reduced (referring to FIG. 12D for the resist film 60).

<Example of Interconnects 14>

First Example

Figure 18:
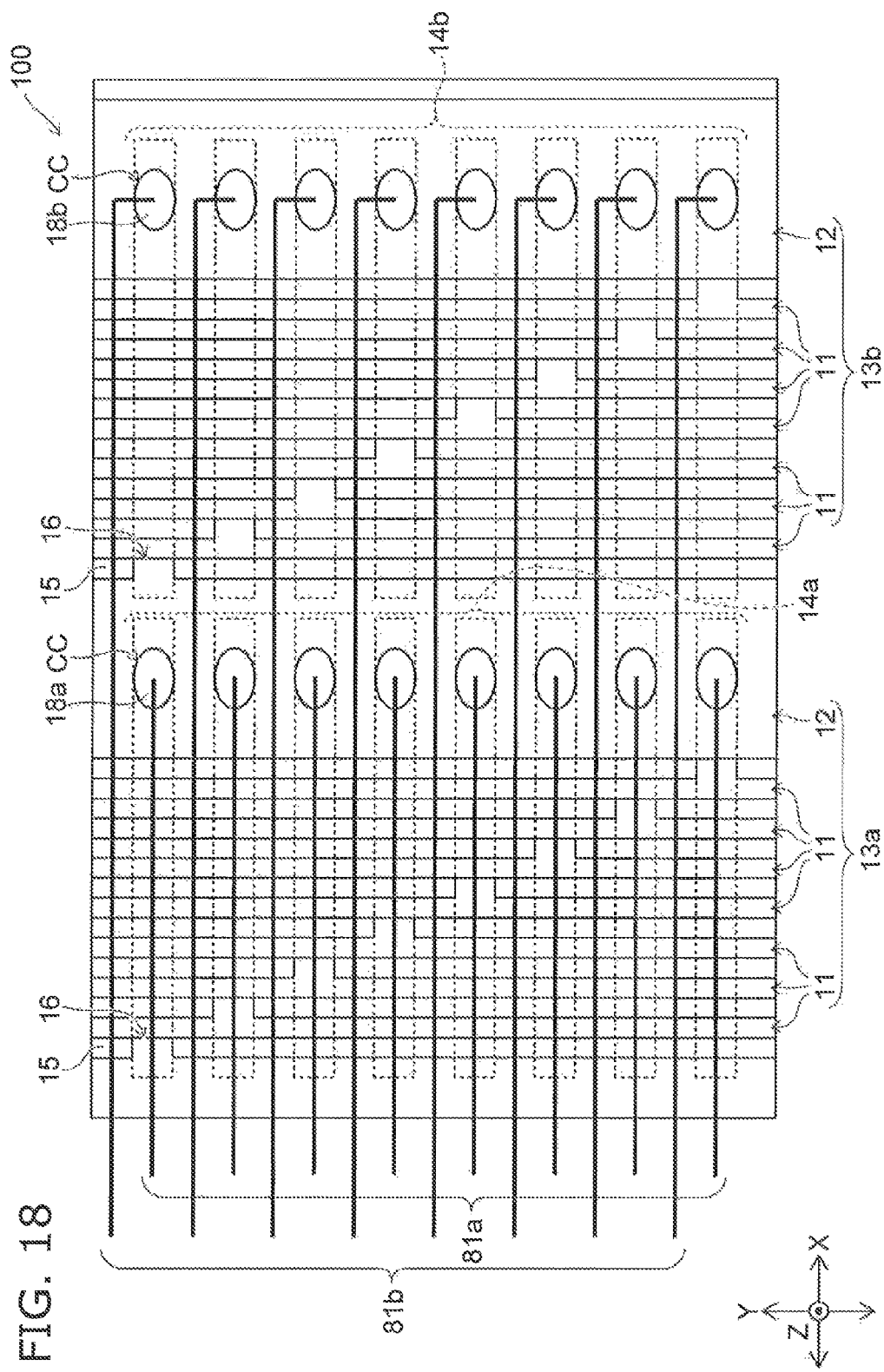
FIG. 18 is a schematic plan view showing a first example of the interconnects of the semiconductor device of the embodiment.

FIG. 18 is a schematic plan view showing a first example of the interconnects 14 of the semiconductor device of the embodiment.

In the embodiment described above, the multiple interconnects 14 are disposed not to be arranged in one straight line along the X-direction.

As shown in FIG. 18, for example, it is also possible to dispose the interconnects 14a and the interconnects 14b to be arranged in one straight line along the X-direction. In such a case, the interconnects 81 are, for example, multilayer interconnects and are divided between the layers of interconnects 81a connected to the interconnects 14a and interconnects 81b connected to the interconnects 14b. For example, the interconnects 81a are provided in a lower layer; and the interconnects 81b are provided in a layer higher than the interconnects 81a.

As in the first example, for example, the interconnects 14a and the interconnects 14b are disposed to be arranged in one straight line along the X-direction. In such a case as well, the number of stacks of the electrode layers 41 can be increased. Accordingly, for example, the semiconductor device of the embodiment can be applied more effectively to a semiconductor device in which the interconnects 14a and the interconnects 14b are disposed to be arranged in one straight line along the X-direction.

Second Example

Figure 19:
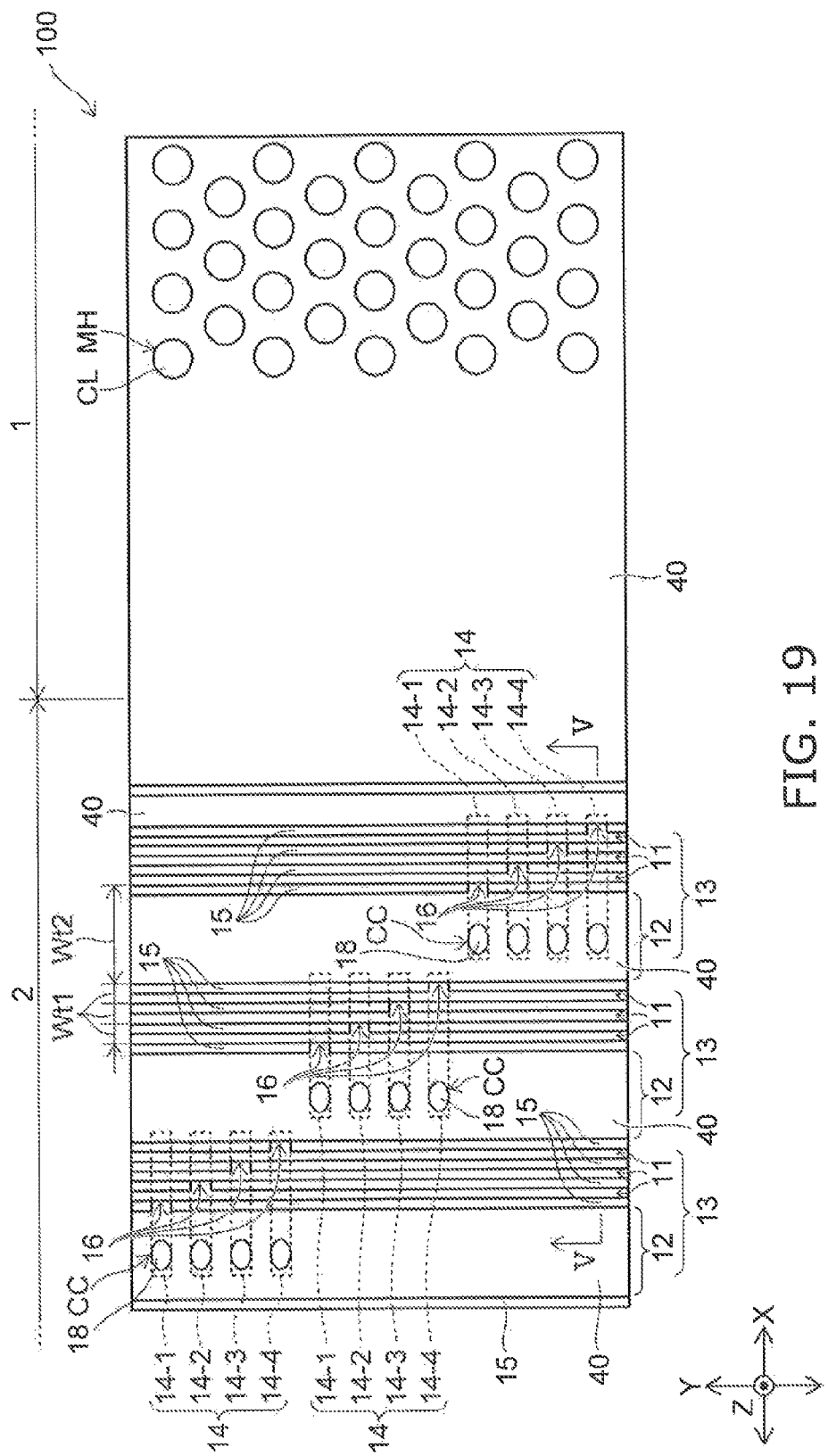
FIG. 19 is a schematic plan view showing a second example of the interconnects of the semiconductor device of the embodiment.

FIG. 19 is a schematic plan view showing a second example of the interconnects 14 of the semiconductor device of the embodiment.

In the embodiment described above, the multiple first terraces 11 and the second terrace 12 disposed above the multiple first terraces 11 are used as one set and are included in one structure body 13. In the one structure body 13, the interconnects 14 are provided from the tops of the multiple first terraces 11 to the top of the second terrace 12 disposed above the multiple first terraces 11. However, the embodiment is not limited to such a structure.

For example, as shown in FIG. 19, one structure body 13 may include the multiple first terraces 11 and the second terrace 12 disposed below the multiple first terraces 11 as one set. In such a case, in the one structure body 13, the interconnects 14 are provided from the tops of the multiple first terraces 11 to the top of the second terrace 12 disposed below the multiple first terraces 11.

Thus, for the interconnects 14, it is possible to select either (1) being provided from the tops of the multiple first terraces 11 to the top of the second terrace 12 disposed above the multiple first terraces 11, and (2) being provided from the tops of the multiple first terraces 11 to the top of the second terrace 12 disposed below the multiple first terraces 11.

Thus, according to the embodiments, a semiconductor device in which it is possible to reduce the planar size of the stairstep portion 2 can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device, comprising:
a stacked body including a plurality of electrode layers, the plurality of electrode layers being stacked with an insulating body interposed, the stacked body including a stairstep portion at an end portion of the stacked body;

a plurality of first terraces provided in the stairstep portion, steps of the first terraces extending in a first direction;

a second terrace provided in the stairstep portion, a second terrace width of the second terrace being wider than a first terrace width of the first terrace, the first and second terrace widths being aligned with a second direction crossing the first direction;

a plurality of interconnects provided from the second terrace to the plurality of first terraces, the plurality of interconnects contacting one of the plurality of electrode layers at the stairstep portion, portions where the interconnects and the electrode layers are in contact being aligned with a plane crossing an upper surface of the second terrace; and a plurality of conductive bodies provided above the second terrace, the plurality of conductive bodies extending in a stacking direction of the stacked body, the conductive bodies contacting the interconnects above the second terrace.

2. The semiconductor device according to claim 1, wherein a structure body including the plurality of first terraces and the second terrace is provided repeatedly in the stairstep portion.

3. The semiconductor device according to claim 1, further comprising a plurality of insulating films provided on the plurality of first terraces and on the second terrace, the insulating films covering side surfaces of the electrode layers, the insulating films having exposed regions where the side surfaces of the electrode layers are exposed.

4. The semiconductor device according to claim 3, wherein the interconnects contact the electrode layers via the exposed regions.

5. The semiconductor device according to claim 3, wherein the exposed regions are provided respectively at the first terraces and the second terrace, and the exposed regions provided at the first terraces and the second terrace are arranged in an oblique direction with respect to the first direction when viewed in plan.

6. The semiconductor device according to claim 5, wherein side walls of the insulating films in the exposed regions are aligned with the oblique direction when viewed in plan.

7. The semiconductor device according to claim 5, wherein the relationship $$\tan \theta = B/A$$

is satisfied, where $\theta$ is an angle between the first direction and the oblique direction, A is an arrangement pitch of the interconnects, and B is the first terrace width.

8. The semiconductor device according to claim 1, further comprising:

a plurality of first insulating portions provided along the second direction inside the stacked body; and at least one second insulating portion interposed between the first insulating portions and provided along the second direction inside the stacked body, a length in the second direction of the second insulating portion being shorter than the first insulating portions, the second insulating portion dividing, along the second direction, at least one layer of the electrode layers in the upper layers of the plurality of electrode layers, the second insulating portion not dividing the remaining electrode layers.

9. The semiconductor device according to claim 1, wherein the plurality of conductive bodies is disposed in a staggered configuration above the second terrace when viewed in plan.

10. The semiconductor device according to claim 2, wherein structure bodies including a first structure body and a second structure body are provided in the stairstep portion, and the interconnects included in the first structure body are disposed to correspond to spaces extending in the second direction between the interconnect and the interconnect included in the second structure body when viewed in plan.

11. The semiconductor device according to claim 1, further comprising:

a semiconductor body provided inside the stacked body and extending in the stacking direction of the stacked body, and a charge storage unit provided between the semiconductor body and the electrode layers.

12. A semiconductor device, comprising:

a stacked body including a plurality of electrode layers, the plurality of electrode layers being stacked with an insulating body interposed, the stacked body including a stairstep portion at an end portion of the stacked body;

a plurality of terraces provided in the stairstep portion;

a plurality of insulating films provided on the plurality of terraces and covering side surfaces of the electrode layers, the insulating films having exposed regions where the side surfaces of the electrode layers are exposed; and a plurality of interconnects provided to straddle at least two of the plurality of terraces, the plurality of interconnects contacting the electrode layers via the exposed regions.

13. The semiconductor device according to claim 12, wherein the exposed regions are provided respectively at the plurality of terraces, and the exposed regions are arranged in an oblique direction with respect to a first direction, steps of the terraces extend in the first direction when viewed in plan.

14. The semiconductor device according to claim 13, wherein side walls of the insulating films in the exposed regions are aligned with the oblique direction when viewed in plan.

15. The semiconductor device according to claim 13, wherein the relationship $$\tan \theta = B/A$$

is satisfied, where $\theta$ is an angle between the first direction and the oblique direction, A is an arrangement pitch of the interconnects, and B is a terrace width along a second direction of the terrace, the second direction crossing the first direction.

16. The semiconductor device according to claim 12, further comprising:

a semiconductor body provided inside the stacked body and extending in the stacking direction of the stacked body, and a charge storage unit provided between the semiconductor body and one of the electrode layers.

17. A method for manufacturing a semiconductor device, comprising:

forming a stacked body including a plurality of electrode layers, the plurality of electrode layers being stacked with an insulating body interposed;

forming a stairstep portion in an end portion of the stacked body, the stairstep portion including a plurality of first terraces and a second terrace, steps of the first terraces extending in the first direction, a second terrace width of the second terrace being wider than a first terrace width of the first terrace, the first and second terrace widths being aligned with a second direction crossing the first direction;

forming a plurality of insulating films on the plurality of first terraces and on the second terrace to cover side surfaces of the plurality of electrode layers;

forming, in the insulating films, exposed regions where the side surfaces of the electrode layers are exposed;

forming a plurality of interconnects from the second terrace to the plurality of first terraces, the plurality of interconnects contacting the electrode layers via the exposed regions; and forming a plurality of conductive bodies above the second terrace, the plurality of conductive bodies respectively contacting the plurality of interconnects.

18. The method for manufacturing the semiconductor device according to claim 17, wherein the exposed regions are formed using a mask material having a hole extending in an oblique direction with respect to the first direction when viewed in plan.

19. The method for manufacturing the semiconductor device according to claim 18, wherein
the relationship $$\tan \theta = B/A$$

is satisfied, where $\theta$ is an angle between the first direction and the oblique direction, A is an arrangement pitch of the interconnects, and B is the first terrace width.

20. The method for manufacturing the semiconductor device according to claim 17, further comprising:
forming a hole inside the stacked body, the hole extending in a stacking direction of the stacked body;

forming a memory film inside the hole, the memory film including a charge storage unit corresponding to the electrode layers; and forming a semiconductor body inside the hole after forming the memory film.

* * * * *